(12) United States Patent
Komazawa et al.

(10) Patent No.: US 11,842,682 B2
(45) Date of Patent: Dec. 12, 2023

(54) LIGHT EMITTING DEVICE, PHOTOELECTRIC CONVERSION DEVICE, ELECTRONIC DEVICE, LIGHTING DEVICE, AND MOBILE BODY

(71) Applicant: CANON KABUSHIKI KAISHA, Tokyo (JP)

(72) Inventors: Akihito Komazawa, Kanagawa (JP); Hiromasa Tsuboi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 186 days.

(21) Appl. No.: 17/573,735

(22) Filed: Jan. 12, 2022

(65) Prior Publication Data

US 2022/0230585 A1 Jul. 21, 2022

(30) Foreign Application Priority Data

Jan. 21, 2021 (JP) ................................. 2021-008189

(51) Int. Cl.
*G09G 3/3233* (2016.01)
*H04N 23/63* (2023.01)

(52) U.S. Cl.
CPC .......... *G09G 3/3233* (2013.01); *H04N 23/63* (2023.01); *G09G 2300/0426* (2013.01); *G09G 2300/0861* (2013.01); *G09G 2320/0233* (2013.01); *G09G 2320/0257* (2013.01); *G09G 2320/041* (2013.01)

(58) Field of Classification Search
CPC ... G09G 2300/0426; G09G 2300/0819; G09G 2300/0852; G09G 2300/0861; G09G 2320/0233; G09G 2320/0238; G09G 2320/0257; G09G 2320/041; G09G 2320/0626; G09G 2320/0673; G09G 3/3233; H04N 23/63; H10K 59/131
See application file for complete search history.

(56) References Cited

U.S. PATENT DOCUMENTS

| | | | |
|---|---|---|---|
| 10,818,232 B2 | 10/2020 | Tsuboi et al. | |
| 10,867,561 B2 * | 12/2020 | Ota | ...................... H10K 59/131 |
| 10,998,392 B2 | 5/2021 | Tsuboi | |
| 11,087,680 B2 | 8/2021 | Tsuboi et al. | |

(Continued)

FOREIGN PATENT DOCUMENTS

JP 2013-097016 A 5/2013

OTHER PUBLICATIONS

U.S. Appl. No. 17/568,810, filed Jan. 5, 2022.

*Primary Examiner* — Amy R Hsu
(74) *Attorney, Agent, or Firm* — Venable LLP

(57) ABSTRACT

The light emitting device comprises: a plurality of pixels, each having a light-emitting element, a driving transistor configured to drive the light-emitting element, a capacitor configured to hold a threshold voltage of the driving transistor, a signal line, a first switch configured to connect the signal line and a control electrode of the driving transistor, and a second switch configured to connect a first main electrode of the driving transistor and a predetermined node; and a driving circuit configured to drive the signal line. In a preparation period in which the threshold voltage is held in the capacitor, the first switch is controlled to be on and the second switch is controlled to be off, and the driving circuit drives the signal line at a voltage level selected from a plurality of different voltage levels.

12 Claims, 17 Drawing Sheets

(56) References Cited

U.S. PATENT DOCUMENTS

| | | | |
|---|---|---|---|
| 2017/0140707 A1* | 5/2017 | Xu | G09G 3/3233 |
| 2018/0108295 A1* | 4/2018 | Ebisuno | H01L 27/1255 |
| 2020/0126481 A1* | 4/2020 | Tsuboi | G09G 3/3233 |
| 2021/0005142 A1 | 1/2021 | Tsuboi et al. | |
| 2021/0111227 A1 | 4/2021 | Tsuboi | |
| 2021/0375233 A1 | 12/2021 | Nagasaki et al. | |
| 2021/0384280 A1 | 12/2021 | Akiyama et al. | |

* cited by examiner

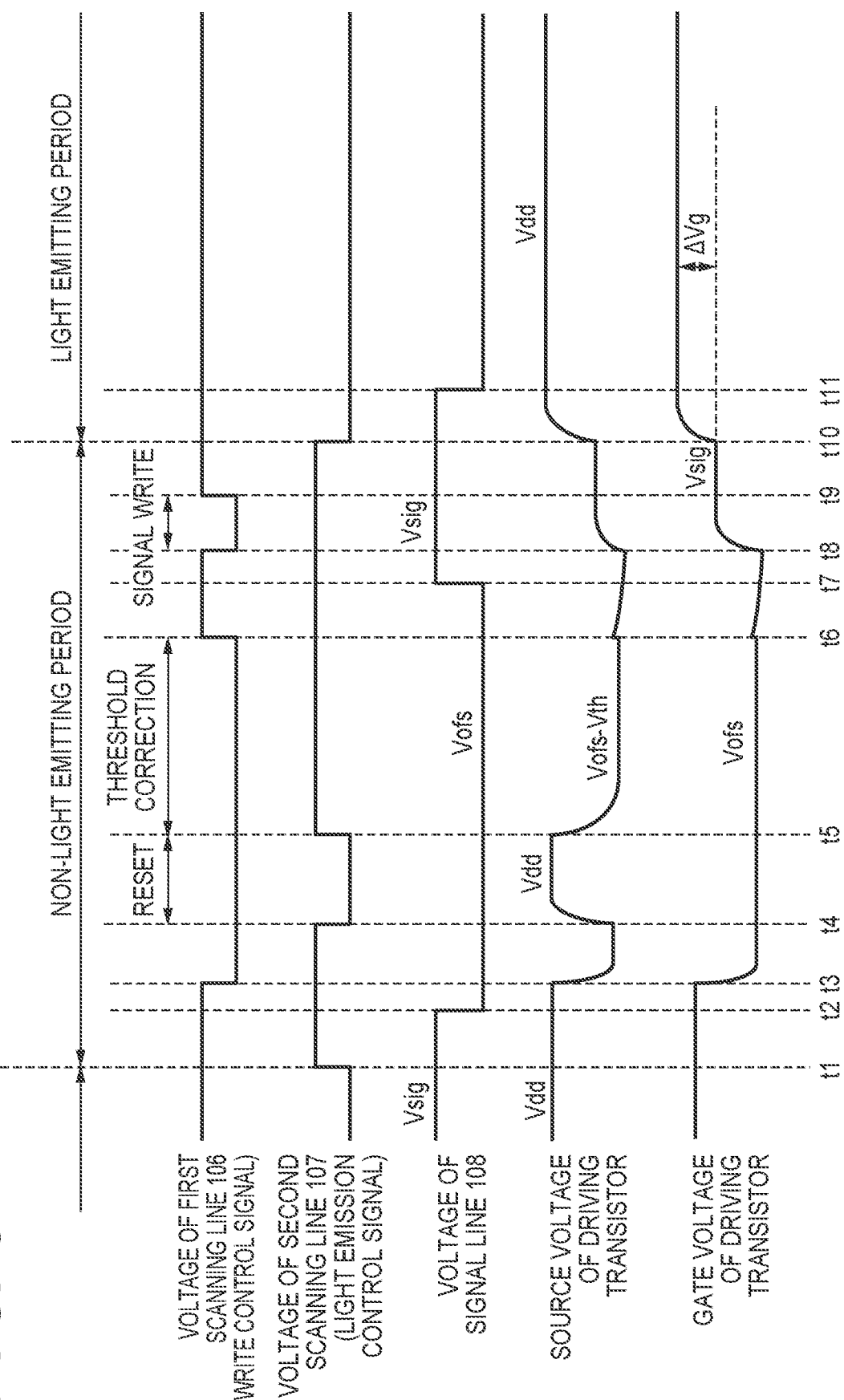

F I G. 10
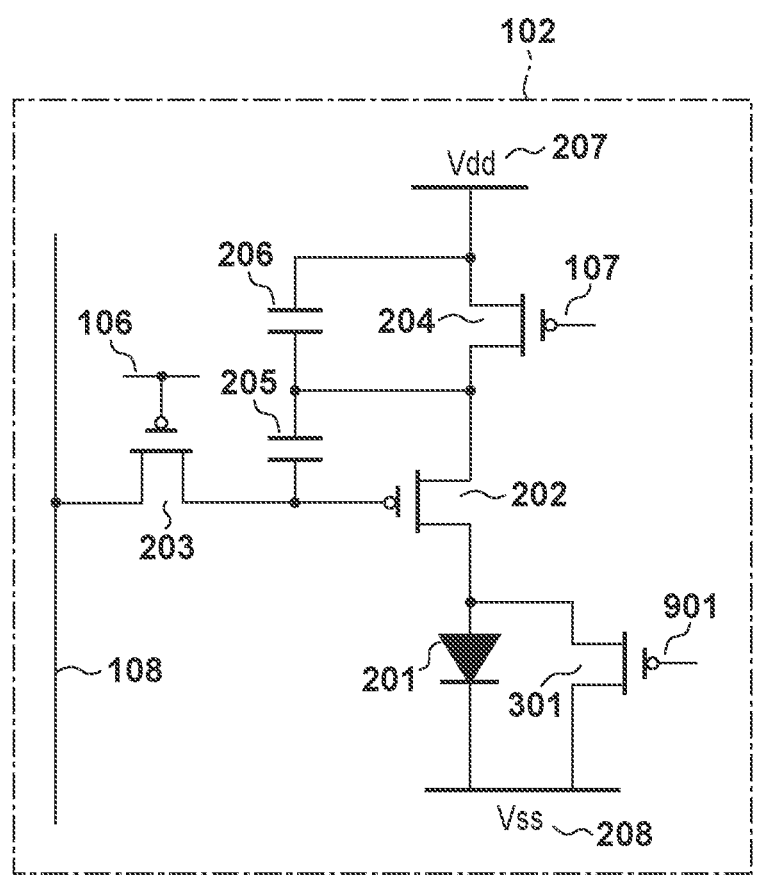

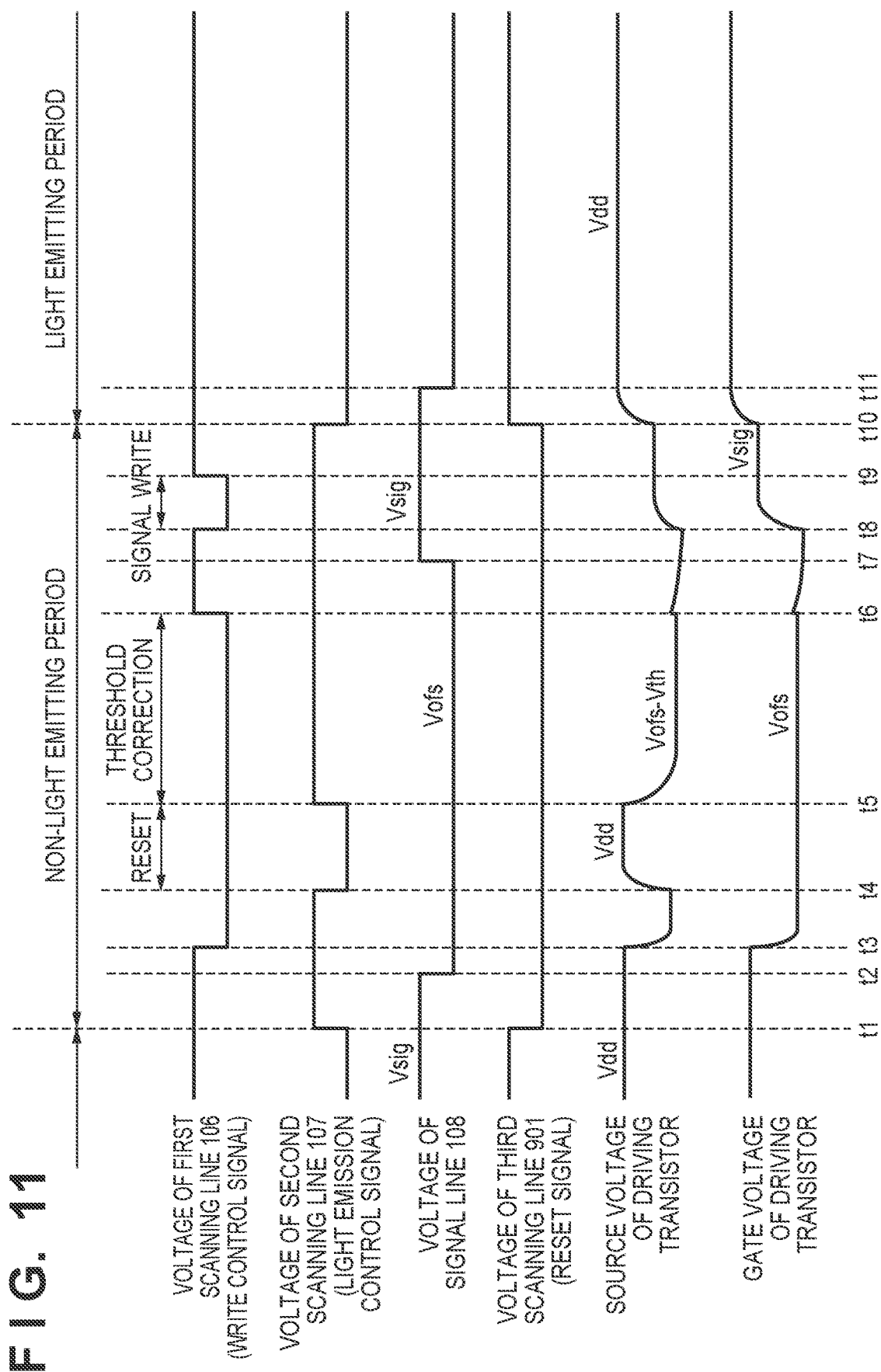

LIGHT EMITTING DEVICE, PHOTOELECTRIC CONVERSION DEVICE, ELECTRONIC DEVICE, LIGHTING DEVICE, AND MOBILE BODY

BACKGROUND OF THE INVENTION

Field of the Invention

The present invention relates to a light emitting device, for example, a light emitting device having an organic light-emitting element.

Description of the Related Art

Japanese Patent Laid-Open No. 2013-097016 (hereinafter PTL 1) discloses a display device comprising organic EL elements and, as a display mode, an image display mode and an aging mode in which the maximum luminance is higher than that of the image display mode. The display device comprises a DAC (Digital to Analog Converter) for converting digital signals that indicate luminance to analog voltages and then supplying the analog voltages to pixels. It is described that, in the aging mode, in order to increase the maximum value of luminance, the maximum luminance is increased by increasing the number of bits of digital signals inputted into the DAC.

With such a method as that of PTL 1 in which the number of bits of digital signals is changed in order to change the analog voltages supplied to the pixels depending on the mode, the limitation in the number of bits of the DAC limits the range of luminance to the range of signal voltages corresponding to the digital signals.

SUMMARY OF THE INVENTION

The present invention has been made in view of the above technical issue and can provide a light emitting device that changes the range of currents that flow through light-emitting elements with respect to signal voltages inputted to the light-emitting elements.

The light emitting device of the present invention comprises: a plurality of pixels, each having a light-emitting element, a driving transistor configured to drive the light-emitting element, a capacitor configured to hold a threshold voltage of the driving transistor, a signal line, a first switch configured to connect the signal line and a control electrode of the driving transistor, and a second switch configured to connect a first main electrode of the driving transistor and a predetermined node; and a driving circuit configured to drive the signal line, wherein in a preparation period in which the threshold voltage is held in the capacitor, the first switch is controlled to be on and the second switch is controlled to be off, and the driving circuit drives the signal line at a voltage level selected from a plurality of different voltage levels, and in a signal write period in which a luminance signal value is written to the light-emitting element, the first switch is controlled to be on and the second switch is controlled to be off, and the driving circuit drives the signal line at a voltage that corresponds to the luminance signal value.

Further features of the present invention will become apparent from the following description of exemplary embodiments (with reference to the attached drawings).

BRIEF DESCRIPTION OF THE DRAWINGS

FIG. 3 is a timing chart of the light emitting device according to the first embodiment.

FIG. 10 is a circuit diagram of an example of a pixel of the light emitting device according to the second embodiment.

FIG. 11 is a timing chart of the light emitting device according to the second embodiment.

DESCRIPTION OF THE EMBODIMENTS

Figure 1:
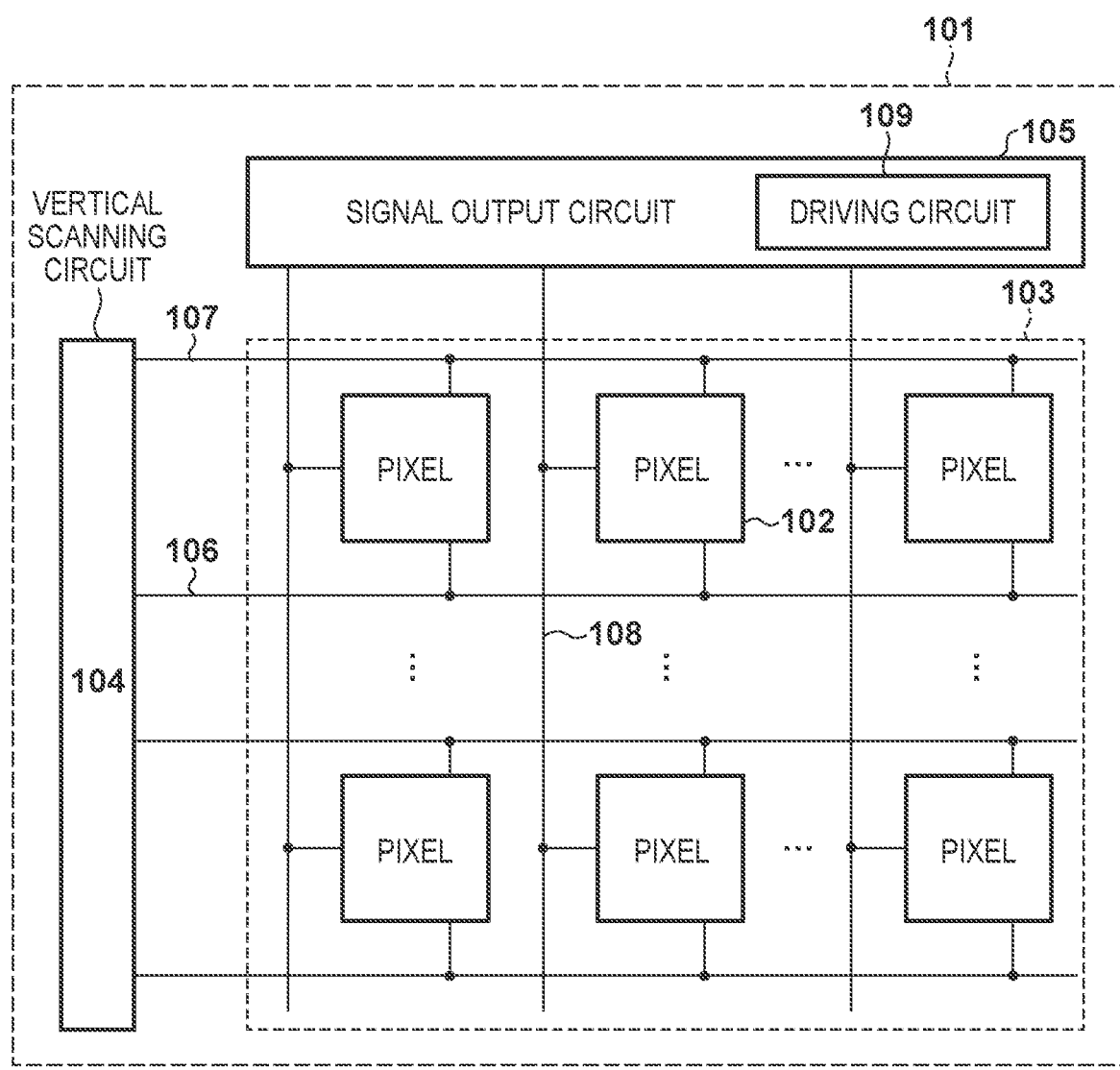
FIG. 1 is a system schematic diagram of an example of a part of a light emitting device according to a first embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

First Embodiment

The following describes a case where a driving transistor is connected to an anode of a light-emitting element—here, an organic electroluminescent (EL) element which is an example of an organic light-emitting element—and all the transistors are P-type transistors; however, a light emitting device of the present embodiment is not limited thereto. The polarity and conductivity type may all be reversed. Further, the driving transistor may be a P-type transistor and other transistors may be N-type transistors, and potential to be supplied and connection may be changed as appropriate, in accordance with the conductivity type and polarity.

FIG. 1 is a schematic system diagram illustrating an example of a part of a light emitting device according to the present embodiment. A light emitting device 101 illustrated in FIG. 1 has a pixel array portion 103 and circuits arranged around the pixel array portion 103. The pixel array portion 103 has a plurality of pixels 102 which have been arranged two-dimensionally in a matrix, and each pixel 102 has an organic light-emitting element.

The circuits arranged in the periphery are circuits for controlling each pixel 102 and include a vertical scanning circuit 104 and a signal output circuit 105. In the pixel array portion 103, a first scanning line 106 and a second scanning line 107 are arranged for each row of pixels in a row direction. Further, a signal line 108 is arranged for each column of pixels in a column direction.

In the vertical scanning circuit 104, the first scanning line 106 and the second scanning line 107 are connected to the output terminals of a corresponding row. The signal line 108 is connected to an output terminal of the signal output circuit 105. The vertical scanning circuit 104 supplies a write control signal to the first scanning line 106 and supplies a light emission control signal to the second scanning line 107.

The signal output circuit 105 includes a driving circuit 109 for outputting the voltage (hereinafter, Vsig) of a luminance signal value corresponding to display data provided in a digital value from an external unit or a predetermined voltage selected from a plurality of different voltage levels.

Figure 2:
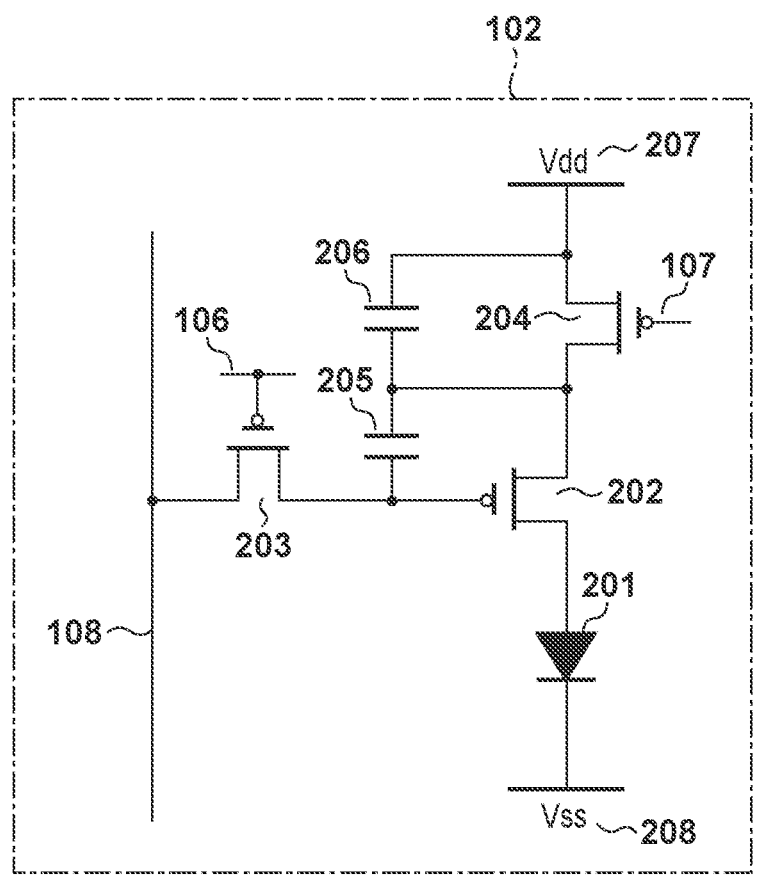
FIG. 2 is a circuit diagram of an example of a pixel of the light emitting device according to the first embodiment.

FIG. 2 is a circuit diagram of an example of a pixel that the light emitting device of FIG. 1 has. As illustrated in FIG. 2, the pixel 102 includes an organic light-emitting element 201, a driving transistor 202, a write transistor 203, a light emission control transistor 204, a first capacitive element 205, and a second capacitive element 206. The organic light-emitting element 201 has an organic layer that includes a light emitting layer between the anode electrode and a cathode electrode. In addition to the light emitting layer, the organic layer may have one or more of a hole injection layer, a hole transport layer, an electron injection layer, and an electron transport layer as appropriate. Here, the total number of transistors and capacitive elements and the combination of conductivity types of the transistors are merely an example, and the present invention is not limited to the present configuration.

Specifically, a main electrode (one of the source and drain (the drain in FIG. 2)) of the driving transistor 202 is connected to a first electrode of the organic light-emitting element 201. The other main electrode (here, the source) of the driving transistor 202 is connected to one of the source and drain (drain in FIG. 2) of the light emission control transistor 204. The other electrode (here, the source) of the light emission control transistor 204 is connected to a node to which a power supply voltage is supplied. Here, the source of the light emission control transistor 204 is connected to a first power supply terminal 207 (hereinafter, Vdd). The light emission control transistor 204 can serve as a switch to connect the source of the driving transistor 202 to the Vdd 207. The second electrode of the organic light-emitting element 201 is connected to a second power supply terminal 208 (hereinafter, Vss). One of the source and drain of the write transistor 203 is connected to a control electrode (here, the gate) of the driving transistor 202, and the other of the source and drain of the write transistor 203 is connected to the signal line 108. The write transistor 203 can serve as a switch to connect the gate of the driving transistor 202 to the signal line 108.

The gate of the write transistor 203 is connected to the first scanning line 106. The gate of the light emission control transistor 204 is connected to the second scanning line 107. A predetermined row of pixels can be selected by driving the first scanning line 106 and the second scanning line 107.

The first capacitive element 205 is connected between the gate and one of the source and drain (the source in FIG. 2) of the driving transistor 202. The second capacitive element 206 is connected between one of the source and drain (the source in FIG. 2) of the driving transistor 202 and the Vdd 207. Both the first capacitive element 205 and the second capacitive element 206 are connected to the source of the driving transistor 202. The first capacitive element 205 and the second capacitive element 206 may be a parasitic capacitance or capacitance having a MIM (Metal-Insulator-Metal) construction.

An overview of an operation in a light emitting period in which the organic light-emitting element 201 emits light will be described below. The driving transistor 202 supplies the organic light-emitting element 201 with current from the Vdd 207 and causes the organic light-emitting element 201 to emit light. More specifically, the driving transistor 202 supplies the organic light-emitting element 201 with a current corresponding to a signal voltage that the signal line 108 has. This causes the organic light-emitting element 201 to be current-driven and thereby emit light.

When the organic light-emitting element 201 emits light, the write transistor 203 is in a conductive state responding to a write control signal applied to the gate from the vertical scanning circuit 104 via the first scanning line 106. This causes the write transistor 203 to write, to the pixel 102, a voltage corresponding to a luminance signal value supplied from the signal output circuit 105 via the signal line 108. This written signal voltage is applied to the gate of the driving transistor 202.

The light emission control transistor 204 supplies the driving transistor 202 with current from the Vdd 207 by entering a conductive state in response to a light emission control signal applied to the gate from the vertical scanning circuit 104 via the second scanning line 107. This makes it possible for the driving transistor 202 to cause the organic light-emitting element 201 to emit light. That is, the light emission control transistor 204 has a function as a transistor for controlling the light emission and non-light emission of the organic light-emitting element 201. In this way, the switching operation of the light emission control transistor 204 makes controlling the ratio between the light emitting period and non-light emitting period of the organic light-emitting element 201—so-called duty control—possible. This duty control makes it possible to reduce blurring due to an afterimage caused by the pixel 102 emitting light during the light emitting period in one frame period, in particular, improve image quality for when a moving image is displayed.

At the time the organic light-emitting element 201 is caused to emit light, the amount of current that flows through the driving transistor 202 is changed in accordance with luminance. By this, the capacitance between the first electrode (here, the anode) and the second electrode (here, the cathode) of the organic light-emitting element 201 is charged to a predetermined potential, and then a current corresponding to the potential difference is supplied. This causes the organic light-emitting element 201 to emit light of predetermined luminance.

Due to variation at the time of manufacturing the elements, the threshold voltage of the driving transistor 202 may differ for each pixel. If the same Vsig is written to a plurality of pixels of the same emission color, the amount of current that flows through the driving transistor 202 will differ for each pixel, causing the amount of light emission to vary.

Therefore, before Vsig is supplied to the gate of the driving transistor 202, a so-called threshold correction operation for causing the gate-source capacitance of the driving transistor 202 to hold the threshold voltage of the driving transistor 202 is performed. This threshold correction operation makes it possible to reduce the variation in the amount of current in the driving transistor 202 in each pixel and is thereby advantageous for realizing uniform light emission.

The threshold correction operation is performed during a preparation period in the non-light emitting period, which precedes light emission. The overview of the threshold correction operation is as follows. Assume that after a current is supplied to the organic light-emitting element 201 via the light emission control transistor 204 and the driving transistor 202, the light emission control transistor 204 is turned off.

By this, a current is supplied to the organic light-emitting element 201 until the gate-source voltage of the driving transistor 202 settles. When the gate-source voltage settles, the threshold voltage can be maintained at the gate-source capacitance. The threshold correction operation will be described below with reference to a timing chart illustrated in FIG. 3.

Here, a threshold correction operation using one frame including a non-light emitting period and a light emitting period as illustrated in FIG. 3 will be described as an example. Before time t1 is a light emitting period of the organic light-emitting element 201 in the previous frame. In the light emitting period, the light emission control transistor 204 is in an on state, and the write transistor 203 is in an off state.

A new frame begins at time t1. At time t1, the light emission control transistor 204 is turned off by a light emission control signal 107 transitioning from Low to High. Accordingly, no current is supplied from the Vdd 207 to the organic light-emitting element 201 via the light emission control transistor 204 and the driving transistor 202, causing the organic light-emitting element 201 to enter a non-light emitting state. At time t2, the driving circuit 109 switches the voltage of the signal line 108 from Vsig to a threshold correction voltage (hereinafter, Vofs) that is supplied when the threshold correction operation is performed.

At time t3, the write transistor 203 is turned on by a write control signal 106 transitioning from High to Low. This causes Vofs of the signal line 108 to be written to the gate of the driving transistor 202. Also, since the source voltage of the driving transistor 202 is in a floating state, the source voltage is influenced by capacitive coupling between the gate and source of the driving transistor 202 and thereby changes.

At time t4, the light emission control transistor 204 is turned on by the light emission control signal 107 transitioning from High to Low. This causes the source voltage of the driving transistor 202 to be a voltage substantially equal to the Vdd 207. A period for initializing the gate potential of the driving transistor 202 to Vofs and the source voltage of the driving transistor 202 to Vdd in this manner is referred to as a reset period. In the reset period, since a current is supplied from the Vdd 207 to the organic light-emitting element 201 via the light emission control transistor 204 and the driving transistor 202, the anode of the organic light-emitting element 201 is charged, causing an anode potential (hereinafter, Vel) to increase. At this time, Vel is desirably a potential that is less than a light emission threshold voltage of the organic light-emitting element 201; however, if the reset period is sufficiently short, the amount of light emission is will be sufficiently small, and so the present invention is not limited to this.

At time t5, the light emission control transistor 204 is turned off by the light emission control signal 107 transitioning from Low to High. A threshold voltage Vth is Vg-Vs for around the time a current starts to flow to the driving transistor 202. By the light emission control transistor 204 turning off, the source voltage of the driving transistor 202 (hereinafter, Vs) changes to a differential voltage between Vofs and the threshold voltage (hereinafter, Vth) of the driving transistor 202, Vs=Vofs-Vth, then settles. At this time, since the gate voltage (hereinafter, Vg) of the driving transistor 202 is Vg=Vofs, Vth is held in the first capacitive element 205. The preparation period (period from time t5 to time t6) in the non-light emitting period in which the threshold correction operation is performed is referred to as a threshold correction period. Therefore, the light emission control transistor 204 and the first capacitive element 205 function as a threshold correction unit for compensating the threshold voltage Vth with respect to an input voltage to the driving transistor 202.

At time t6, the write transistor 203 is turned off by the write control signal 106 transitioning from Low to High. At time t7, the signal voltage of the signal line 108 switches from Vofs to Vsig.

At time t8, the write transistor 203 is turned on by the write control signal 106 transitioning from High to Low. This causes Vsig of the signal line 108 to be written to the gate of the driving transistor 202. A period in which the gate voltage of the driving transistor 202 is set to Vsig in this manner is a signal write period. Also, since the gate voltage of the driving transistor 202 changes from a voltage that is substantially equal to Vofs to Vsig, the source voltage of the driving transistor 202 increases due to capacitive coupling between the gate and source of the driving transistor 202. The source voltage Vs of the driving transistor 202 becomes Vs=Vofs−Vth+ΔVs.

Here, ΔVs is expressed by the following Equation (1) using a capacitance value C1 of the first capacitive element 205, a capacitance value C2 of the second capacitive element 206, the gate-source capacitance of the driving transistor 202, and a source capacitance Cs excluding the source-Vdd capacitance.

$$\Delta Vs = (Vsig - Vofs) \cdot C1/(Cs + C1 + C2) \quad (1)$$

At time t9, the write transistor 203 is turned off by the write control signal 106 transitioning from Low to High.

At time t10, the light emission control transistor 204 is turned on by the light emission control signal 107 transitioning from High to Low. At this time, the source voltage of the driving transistor 202 becomes a voltage substantially equal to the Vdd 207. Then, a current is supplied from the Vdd 207 to the organic light-emitting element 201 via the light emission control transistor 204 and the driving transistor 202. This causes the anode of the organic light-emitting element 201 to be charged, thereby increasing Vel.

By Vel becoming a potential that is the light emission threshold voltage or more, the organic light-emitting element 201 emits light.

Also, since the source voltage of the driving transistor 202 changes from a voltage that is substantially equal to the Vdd 207, the gate voltage of the driving transistor 202 increases due to capacitive coupling between the gate and source of the driving transistor 202. The gate voltage Vg of the driving transistor becomes Vg=Vsig+ΔVg. Here, ΔVg is expressed by the following Equation (2) using the gate capacitance Cg excluding the gate-source capacitance of the driving transistor 202.

$$\Delta Vg = (Vdd - Vs) \cdot C1/(Cg + C1) \quad (2)$$

Here, if Cg is the parasitic capacitance between the gate and drain of the driving transistor 202 and the parasitic capacitance between the gate of the write transistor 203 and the gate of the driving transistor 202, it will be assumed that Cg is sufficiently small with respect to C1. If Cg is ignored due to being sufficiently small, Equation (2) will be further expressed by Equation (3) using Equation (1).

$$\Delta Vg = Vdd - \{Vofs - Vth + (Vsig - Vofs) \cdot C1/(Cs + C1 + C2)\} \quad (3)$$

Here, since the Vth is held in the first capacitive element 205 due to the threshold correction operation from time t5 to time t6, the threshold voltage at the gate of the driving transistor 202 is canceled. Therefore, regarding currents that flow through the driving transistor 202, so long as Vsig written to each pixel is the same, even if there is a variation in the threshold voltage Vth of the driving transistor 202, the effect of the variation can be reduced. Therefore, it is possible to achieve uniform light emission between pixels of the same emission color. Incidentally, from time t1 to time t10 is a non-light emitting period.

At time t11, the voltage of the signal line 108 switches from Vofs to Vsig.

Figure 4A:
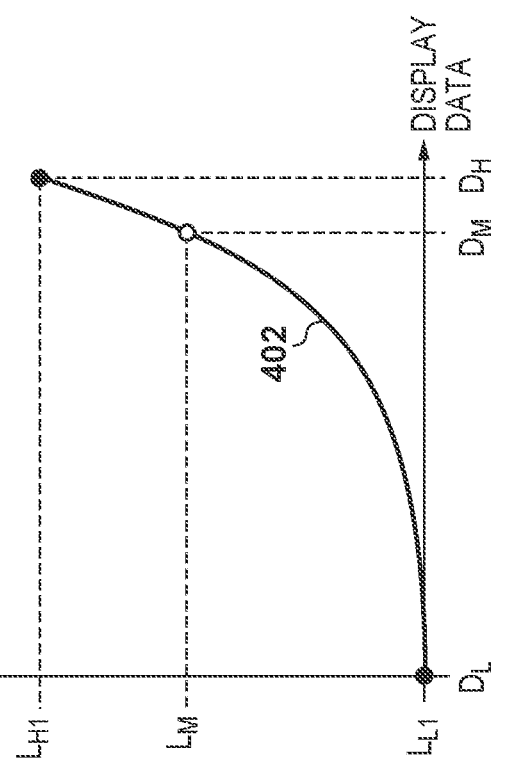
FIG. 4A is a diagram of an electrical characteristic of a pixel in the light emitting device.

Next, the relationship between a current that flows through the light-emitting element and a signal voltage (Vsig) for driving the driving transistor 202 and will be described with reference to FIG. 4A. FIG. 4A illustrates the electrical characteristic of the pixel of FIG. 2. A curve 401 indicates the current characteristic of the driving transistor 202 with respect to the voltage Vsig, and the vertical axis is displayed using a logarithmic scale. Here, assume that Vsig to be written to a pixel is respectively VM, VH1, and VL1, and their magnitude relation is VH1<VM<VL1. At this time, the currents that flow through the P-type driving transistor 202 corresponding to voltages VM, VH1, and VL1 are IM, IH1, and IL1, respectively.

Figure 4B:
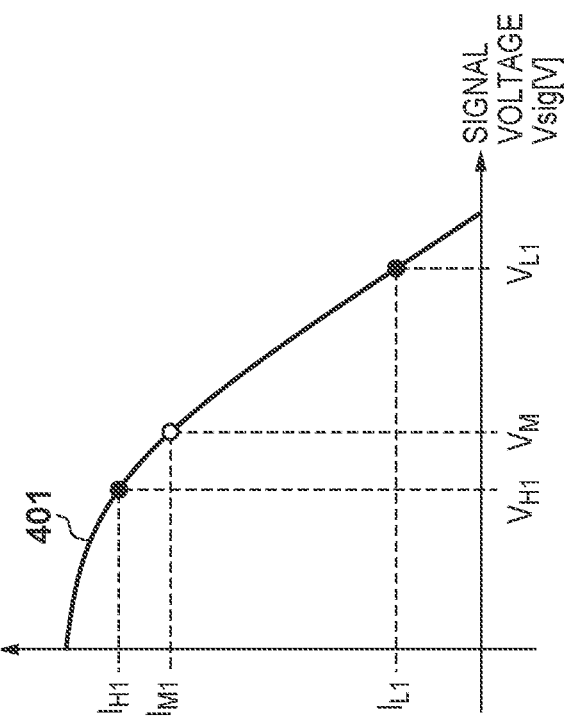
FIG. 4B is a diagram of a light emission characteristic in the light emitting device.

FIG. 4B illustrates a light emission characteristic of the light emitting device of FIG. 1. A curve 402 is a gamma curve in a first display mode. The voltages corresponding to display data DM, largest display data DH, and smallest display data DL are VM, VH1, and VL1, respectively, of FIG. 4A. The current that flows through the driving transistor 202 and luminance that the organic light-emitting element 201 emits are in an approximately proportional relationship, and for display data DM, DH, and DL, the luminance is LM, LH1, and LL1, respectively. Therefore, when the largest display data DH is provided, the corresponding luminance LH1 is the maximum luminance. Next, improving the luminance while the range of the display data remains unchanged will be described. According to the above Equation (3), ΔVg can be changed by the value of Vofs. Here, assume that the threshold correction voltage is Vofsa and Vofsb, and Vofsa<Vofsb. In this case, the gate voltages Vga and Vgb of the driving transistor during the light emitting period, are Vga=Vsig+ΔVga and Vgb=Vsig+ΔVgb, respectively. ΔVga and ΔVgb are expressed by the following Equations (4) and (5) using Equation (3).

$$\Delta Vga = Vdd - \{Vofsa - Vth + (Vsig - Vofsa) \cdot C1/(Cs + C1 + C2)\} \quad (4)$$

$$\Delta Vgb = Vdd - \{Vofsb - Vth + (Vsig - Vofsb) \cdot C1/(Cs + C1 + C2)\} \quad (5)$$

The potential difference between ΔVga and ΔVgb is expressed by the following Equation (6) using Equations (4) and (5).

$$|\Delta Vgb - \Delta Vga| = (Vofsb - Vofsa) \cdot (Cs + C2)/(Cs + C1 + C2) \quad (6)$$

Figure 5A:
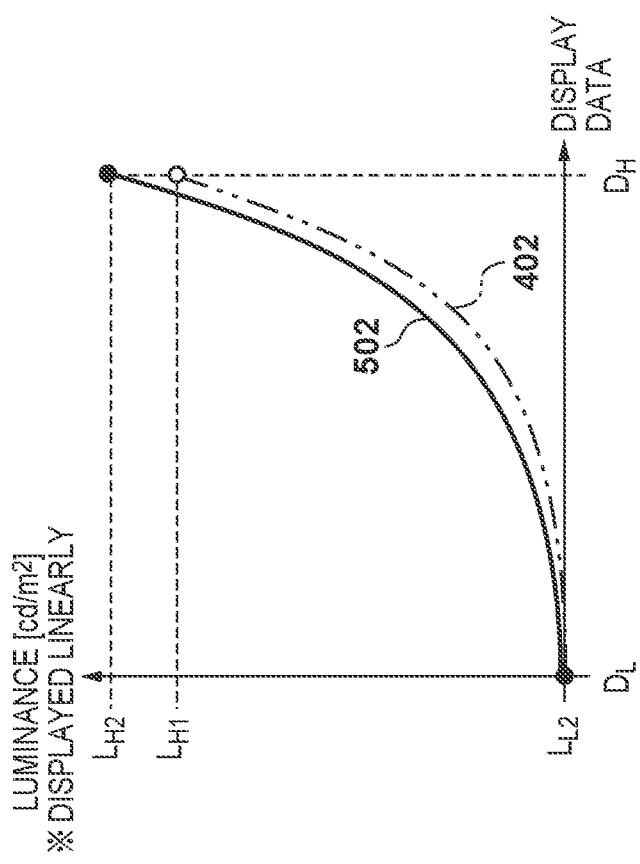
FIG. 5A is a diagram of an electrical characteristic of a pixel of the light emitting device according to the first embodiment.

It can be seen from Equation (6) that when Vofs is increased, the curve 401 of FIG. 4A indicating a characteristic can be shifted in a direction (to the right the drawing) in which Vsig increases as in a curve 501 illustrated in FIG. 5A. The curve 501 indicates the current characteristic of the driving transistor 202 with respect to Vsig when Vofs is increased, and the vertical axis is displayed using a logarithmic scale. The curve 501 indicating signal voltage (Vsig)-to-current characteristic when Vofs is increased can be a shape of the curve 401 slightly shifted along the positive direction of the horizontal axis. When emitting the maximum luminance and minimum luminance, Vsig written to a pixel is VH1 and VL1, respectively, for the curve 401. When the signal voltage is VH2 and VL2 and VH2=VH1 and VL2=VL1, the currents are values corresponding to the points of intersection indicated by black dots on the curve 501. That is, when the range from the minimum value to maximum value of the signal voltage is the same and Vofs is increased, the current that flows through the driving transistor 202 corresponding to the signal voltages VH2 and VL2 are IH2 and IL2, respectively, and are greater than IH1 and IL1 indicated on the curve 401.

As described above, in the threshold correction operation, it is possible to change the Vsig-to-driving current characteristic by selecting, as the voltage Vofs that the driving circuit 109 outputs, Vofsa or Vofsb from among a plurality of different voltages, and then driving the signal line. In the below, the light emitting state of the light emitting device corresponding to the curve 401 will be referred to as the first display mode, and the light emitting state of the light emitting device corresponding to the curve 501 will be referred to as a second display mode. The operation of selecting the voltage to be outputted by the driving circuit from among the plurality of different voltages can be performed in response to an instruction to the driving circuit 109. The instruction may be performed from an external unit by operating a switch or may be an instruction of the control unit (not illustrated). Incidentally, the control unit may be provided inside or outside of the light emitting device.

Figure 5B:
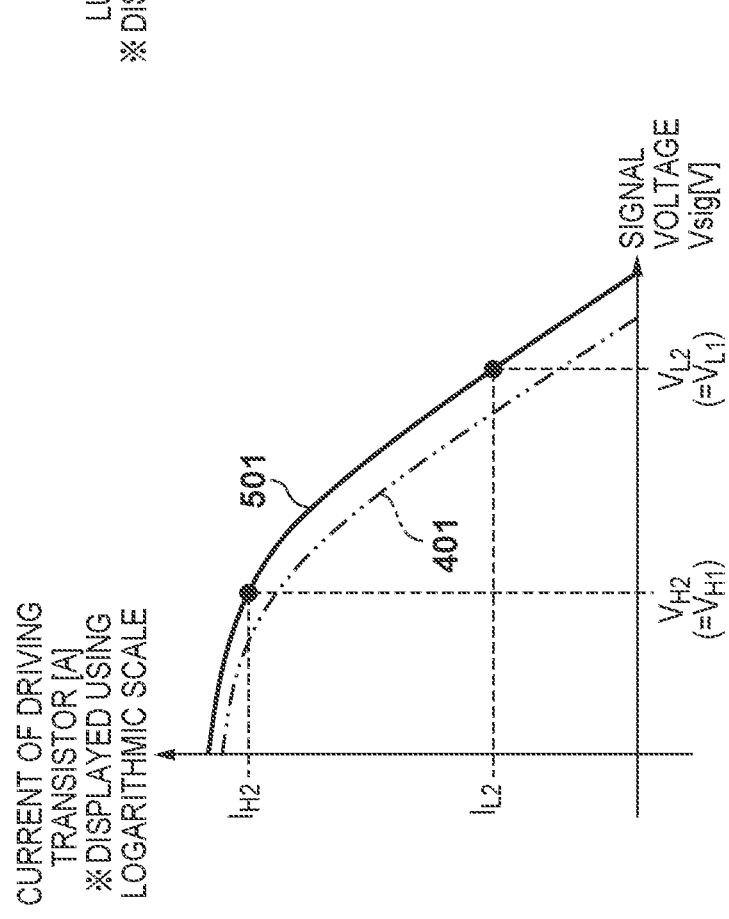
FIG. 5B is a diagram of a light emission characteristic of the light emitting device according to the first embodiment.

A curve 502 illustrated by a solid line in FIG. 5B indicates the light emission characteristic of the light emitting device of FIG. 1 in the second display mode according to the present embodiment. The curve 502 is a gamma curve in the second display mode. The signal voltages corresponding to the display data DH and DL are VH2 and VL2, respectively. The luminance corresponding to the display data DH and the luminance corresponding to the display data DL are the luminance LH2 and LL2, respectively. Here, LH2>LH1, and it is possible to further increase the maximum luminance than before. As described above, according to the present embodiment, increasing Vofs makes it possible to shift the range of the maximum controllable luminance. By this, the luminance can be changed when the signal line 108 is driven at the same signal voltage.

Figure 6A:
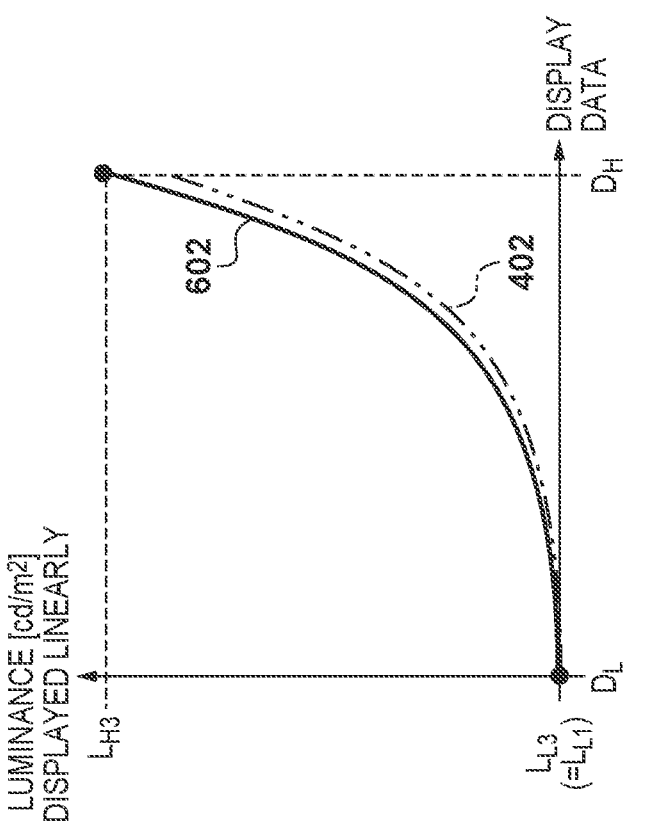
FIG. 6A is a diagram of an electrical characteristic of a pixel of the light emitting device according to the first embodiment.

Next, control on the lower side of luminance will be described with reference to FIG. 6. A curve 601 illustrated by a solid line in FIG. 6A indicates the voltage-to-current characteristic used in the second display mode according to the present embodiment. Assume that the signal voltages to be written to a pixel are VH3 and VL3, VH3 and VH1 are equal, and VL3>VL1. The currents that flow through the driving transistor 202 corresponding to the signal voltages VH3 and VL3 are IH3 and IL3, respectively, and in this example, IL3=IL1 is possible.

Figure 6B:
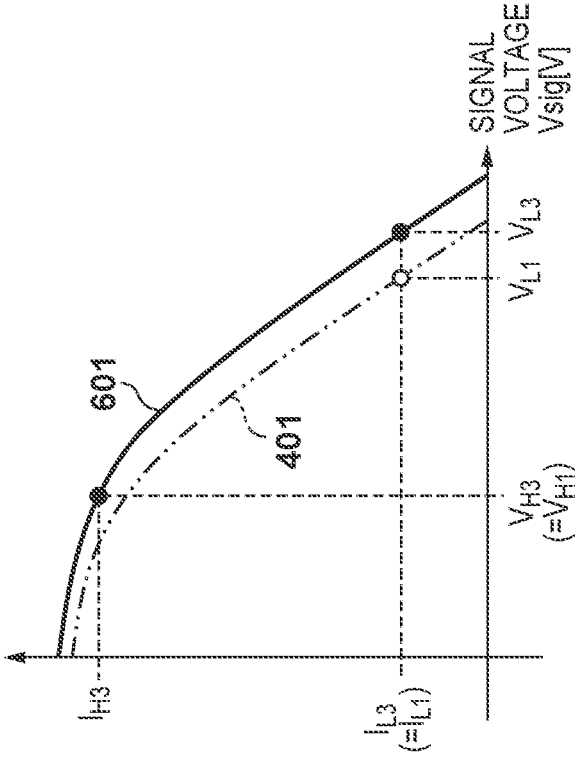
FIG. 6B is a diagram of a light emission characteristic of the light emitting device according to the first embodiment.

FIG. 6B indicates the light emission characteristic of the light emitting device of FIG. 1 in the second display mode according to the present embodiment. A reference numeral 602 is a gamma curve. The signal voltages corresponding to the display data DH and DL are VH3 and VL3, respectively. The luminance corresponding to the display data DH and DL are LH3 and LL3, respectively. Here, LL3=LL1. By setting the signal voltage VL3 corresponding to the minimum luminance as in this example, it is possible to maintain the minimum luminance regardless of the display mode.

Next, referring to FIGS. 7 and 8, it will be described that the signal voltages (Vsig) corresponding to the maximum luminance and minimum luminance and the threshold correction voltage (Vofs) can be controlled corresponding to the change in luminance of the light-emitting element caused by environmental temperature.

Figure 7A:
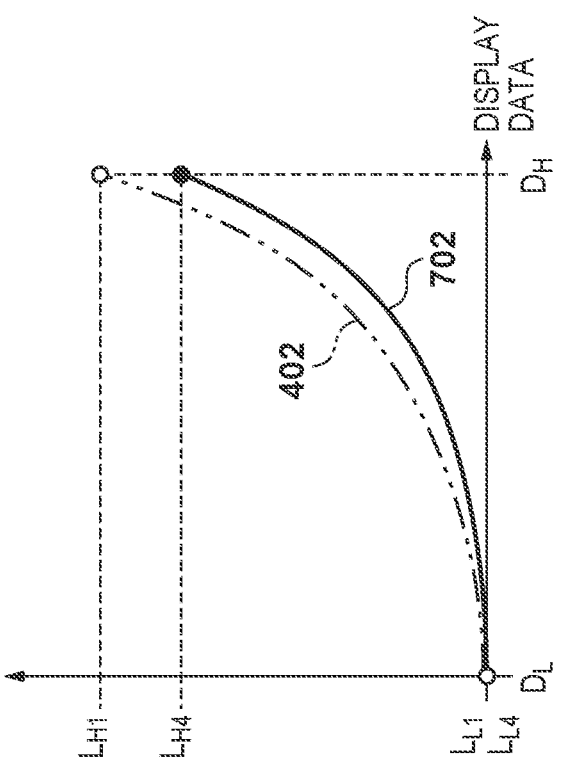
FIG. 7A is a diagram of an electrical characteristic of a pixel of the light emitting device according to the first embodiment.

The curve 401 illustrated by a two-dot dashed line in FIG. 7A indicates the electrical characteristic and the range of signal voltages used in the first display mode of the pixel of FIG. 2. The curve 401 illustrates the signal voltage-to-drive current characteristic for when the threshold correction voltage Vofs=Vofsa. Assume that the environmental temperature of the light-emitting element at the time of the curve 401 is a temperature T1. Meanwhile, regarding a curve 701, the threshold correction voltage Vofs=Vofsa, and the curve 701 indicates the current characteristic of the driving transistor 202 with respect to the voltage Vsig at the time of environmental temperature T2. In either case, the vertical axis, which is the current characteristic, is displayed using a logarithmic scale, and T1>T2. This is because the driving transistor 202 operates in a subthreshold region and a saturated region, and the lower the temperature, the lower the amount of flowing current. Further, in the curve 701, when the maximum luminance and minimum luminance are emitted, the signal voltages to be written to the pixel are VH4 and VL4, respectively. At the time the environmental temperature is T2, the currents that flow through the driving transistor 202 corresponding to the voltages VH4 and VL4 are IH4 and IL4, respectively, and IH4<IH1 and IL4<IL1.

Figure 7B:
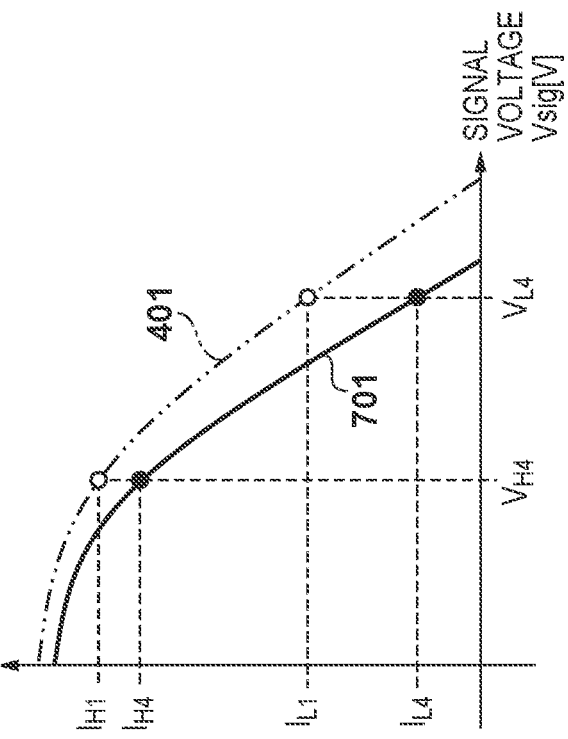
FIG. 7B is a diagram of a light emission characteristic of the light emitting device according to the first embodiment.

FIG. 7B indicates the light emission characteristic of the light emitting device of FIG. 1 in the first display mode. The curves 402 and 702 are gamma curves at the time of environmental temperature T1 and environmental temperature T2, respectively. On the curve 702, the signal voltages corresponding to the display data DH and DL are VH4 and VL4, respectively. The luminance corresponding to the display data DH and DL are LH4 and LL4, respectively. Here, LH4<LH1, LL4<LL1, and the maximum luminance and minimum luminance decrease as temperature decreases.

Figure 8A:
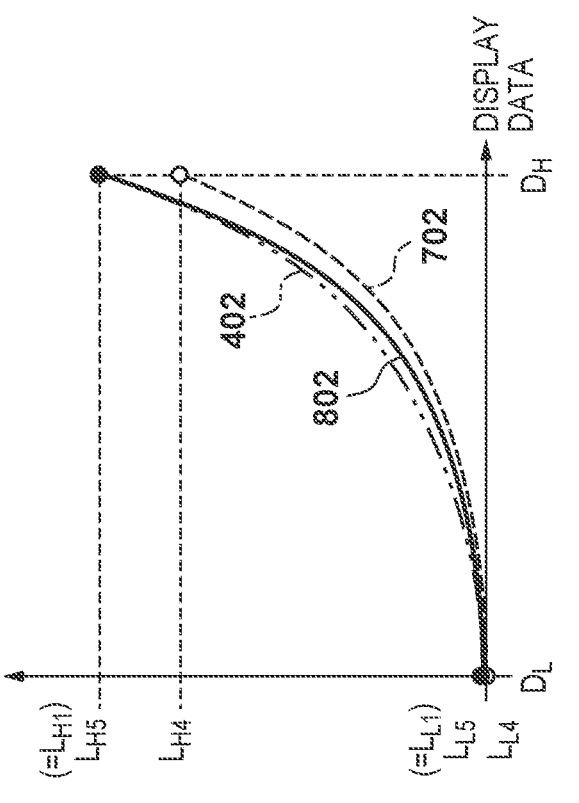
FIG. 8A is a diagram of an electrical characteristic of a pixel of the light emitting device according to the first embodiment.

FIG. 8A illustrates an electrical characteristic and the range of signal voltages of the pixel of FIG. 2. Regarding a curve 801, the threshold correction voltage Vofs=Vofsc; the curve 801 indicates the current characteristic of the driving transistor 202 with respect to the voltage Vsig at the time the environmental temperature is T2; and the vertical axis is displayed using a logarithmic scale. Here, Vofsc>Vofsa. When emitting the maximum luminance and minimum luminance, the signal voltages to be written to the pixel are VH5 and VL5 respectively; VH5=VH4; and VL5<VL4. The currents that flow through the driving transistor 202 corresponding to the signal voltages VH5 and VL5 are IH5 and IL5, respectively, and IH5=IH1 and IL5=IL1 are possible.

Figure 8B:
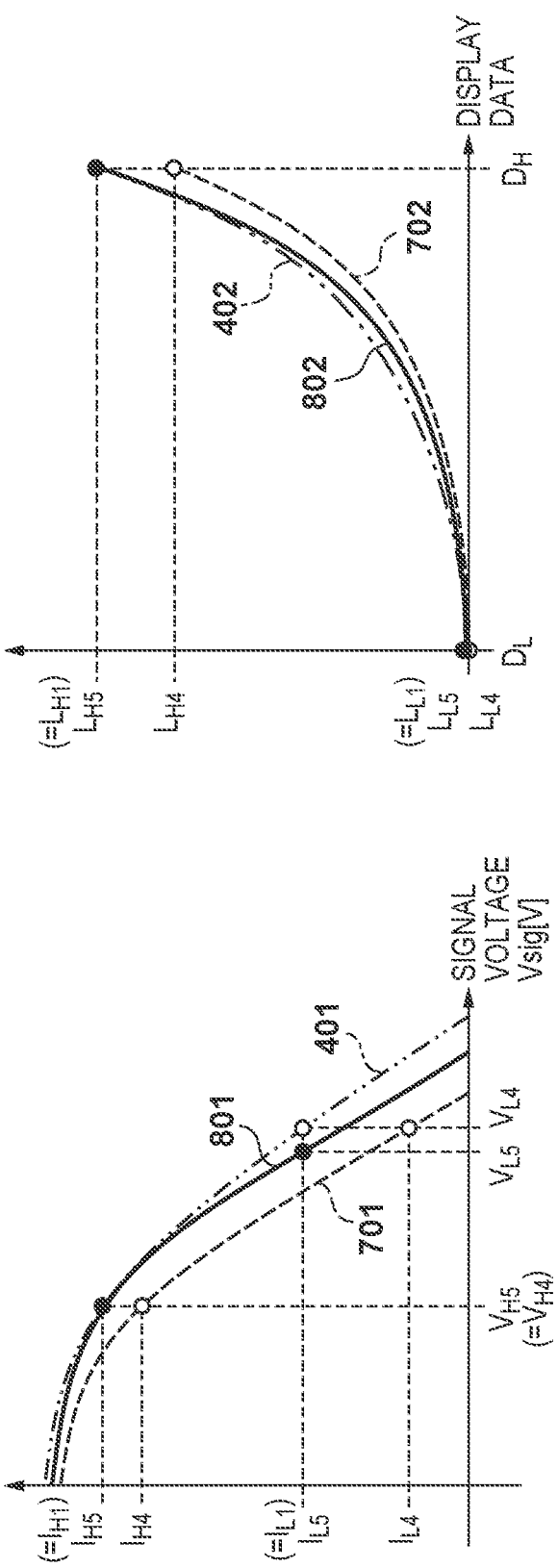
FIG. 8B is a diagram of a light emission characteristic of the light emitting device according to the first embodiment.

FIG. 8B indicates a light emission characteristic of the light emitting device of FIG. 1 in the present example. A curve 802 is a gamma curve at the time of environmental temperature T2. On the curve 802, the signal voltages corresponding to the display data DH and DL are VH5 and VL5, respectively. The luminance corresponding to the display data DH and DL are LH5 and LL5, respectively. Here, LH5=LH1, LL5=LL1, and even when the temperature has decreased, it is possible to maintain the maximum luminance and minimum luminance by appropriately selecting Vofs for driving the signal line at the time of threshold correction operation. The selection of the voltage level of Vofs may be performed by a control unit comprising a temperature sensor for detecting an environmental temperature controlling the driving circuit 109.

Here, in the present embodiment, the case where VH5 and VH4 are equal has been described; however, not only the threshold correction voltage Vofs but also VH5 may be adjusted, as appropriate, in accordance with the amount of change in temperature and maximum luminance. For example, VH5 can be adjusted when the amount of change in maximum luminance is large. According to the configuration of the present embodiment, it is possible to maintain the maximum luminance and minimum luminance when temperature changes.

Second Embodiment

Next, the present embodiment will be described with reference to FIGS. 9 to 11. The present embodiment is an example in which a reset transistor that functions as a switch for connecting the anode of the organic light-emitting element 201 to a Vss 208 has been provided. Hereinafter, a configuration different from that of the first embodiment will be mainly described.

Figure 9:
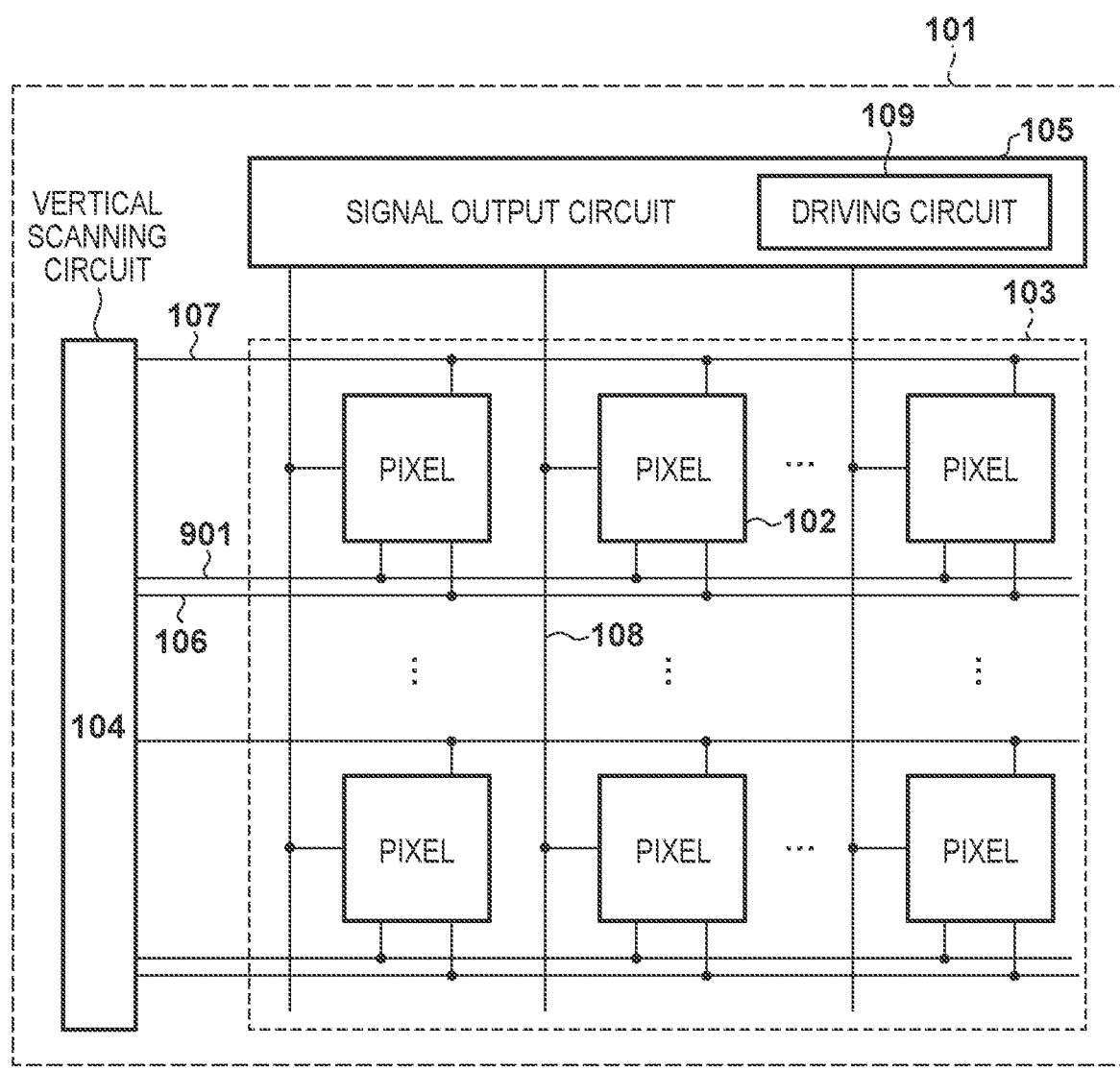
FIG. 9 is a system schematic diagram of an example of a part of a light emitting device according to a second embodiment.

FIG. 9 is a system diagram illustrating an overview of an example of a part of a light emitting device according to the present embodiment. As illustrated in FIG. 9, in the pixel array portion 103, along the row direction, a third scanning line 901 is arranged for each pixel row. The third scanning line 901 is connected to the output terminal of a corresponding row in the vertical scanning circuit 104 and supplies a reset signal to each pixel 102.

FIG. 10 is a circuit diagram of an example of a pixel that the light emitting device of FIG. 9 has. As illustrated in FIG. 10, one of the source and drain (source in FIG. 10) of a reset transistor 301 is connected to one of the source and drain (here, drain) of the driving transistor 202. The other electrode of the reset transistor 301 is connected to the Vss 208. The gate of the reset transistor 301 is connected to the third scanning line 901. In the non-light emitting period, by turning on the reset transistor 301, the anode of the organic light-emitting element 201 can be connected to the Vss 208 and the organic light-emitting element 201 can be caused to enter a non-light emitting state.

FIG. 11 is a timing chart of the light emitting device according to the present embodiment. In FIG. 11, at time t1, the third scanning line 901 becomes High by the reset signal transitioning from High to Low, causing the reset transistor 301 to turn on. At time t10, the reset transistor 301 is turned off by the reset signal transitioning from Low to High. Therefore, during the period from time t1 to t10, the anode potential Vel of the organic light-emitting element 201 will have a voltage substantially equal to the Vss 208, causing the organic light-emitting element 201 to enter a non-light emitting state. According to the configuration of the present embodiment, it is possible to realize a higher contrast display device than the first embodiment.

(Pixel)

The light emitting device has a plurality of pixels. A pixel may include sub-pixels that emit colors different from each other. The sub-pixels may have, for example, emission colors, RGB, respectively. This region can be said to be a light emitting region. In a pixel, a region called a pixel opening emits light. The size of the pixel opening may have a diameter of 15 µm or less or 5 µm or more. More specifically, it may be 11 µm, 9.5 µm, 7.4 µm, 6.4 µm or the like. The spaces between the sub-pixels may be 10 µm or less; more specifically, 8 µm, 7.4 µm, or 6.4 µm.

The pixels may take various forms of arrangement in a plan view. For example, the pixels may be in stripe arrangement, delta arrangement, pentile arrangement, or Bayer arrangement. A sub-pixel in a plan view may take any shape. For example, a rectangle, a quadrilateral such as a rhombus, a hexagon, or the like. The terms relating to shapes listed here are not intended for precise shapes, and a shape would fall under rectangle if it is close to a rectangle. The shape of a sub-pixel and pixel arrangement can be combined and used in various arrangement forms.

(Apparatus to which Light Emitting Device According to Embodiment has been Applied)

Here, an embodiment of a display device to which the light emitting device 101 according to the above embodiment has been applied will be described. First, an overview of a structure of a display device will be described using a cross-sectional schematic view illustrated in FIGS. 12A and 12B. The exemplary display device includes an organic light-emitting element and a transistor connected to the organic light-emitting element. The transistor is an example of an active element, and the transistor may be a thin film transistor (TFT).

Figure 12A:
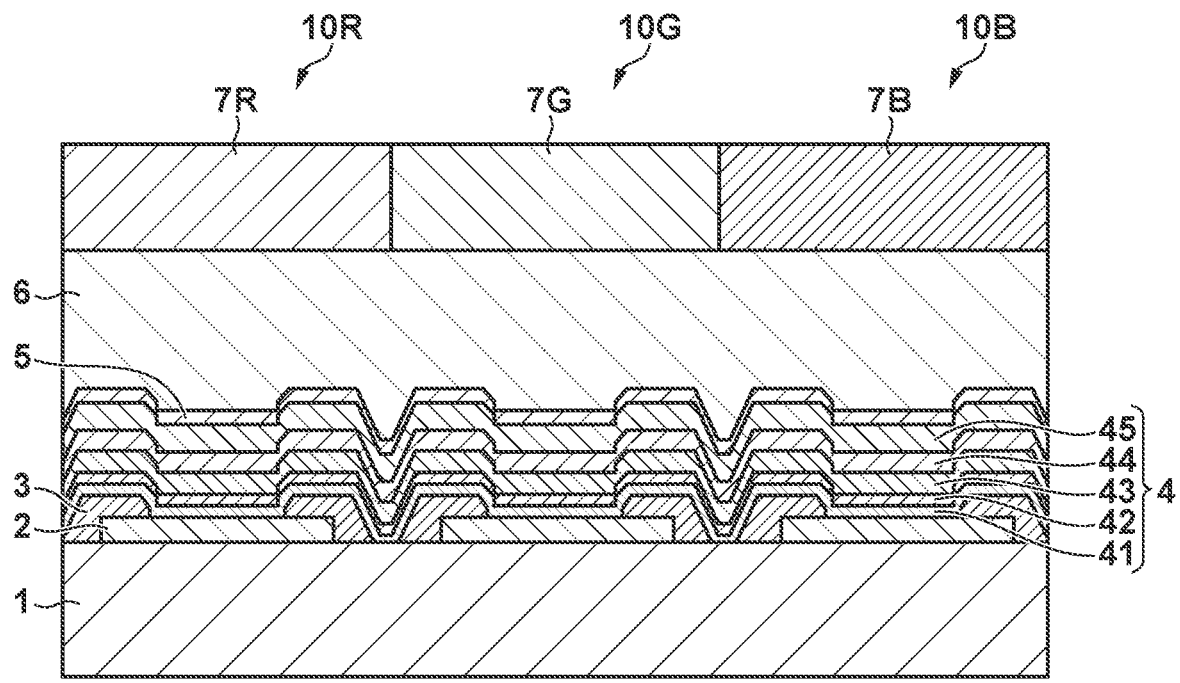
FIG. 12A is a schematic cross-sectional view illustrating an example of a pixel of a light emitting device according to an embodiment.

FIG. 12A schematically illustrates an example of a cross section of a pixel which is a component of the display device according to the present embodiment. The pixel includes a sub-pixel 10. The sub-pixel 10 is divided into sub-pixels 10R, 10G, 10B by emission color. The emission color may be distinguished by the wavelength emitted from the light emitting layer, or the light emitted from the sub-pixel 10 may be selectively transmitted or color-converted by a color filter or the like. Each portion of the sub-pixel 10 includes a first electrode 2 which is a reflecting electrode on an interlayer insulating layer 1, an insulating layer 3 covering the end of the first electrode 2, an organic compound layer 4 covering the first electrode 2 and the insulating layer 3, a second electrode 5, a protective layer 6, and a color filter.

Transistors or capacitive elements may be disposed under or inside the interlayer insulating layer 1.

A transistor and the first electrode 2 may be electrically connected via a contact hole or the like (not illustrated). The insulating layer 3 is also referred to as a bank or pixel isolation film. The insulating layer 3 covers the edges of the first electrode 2 and is arranged surrounding the first electrode 2. The portion where the insulating layer 3 is not arranged contacts the organic compound layer 4 and becomes a light emitting region.

The organic compound layer 4 has a hole injection layer 41, a hole transport layer 42, a first light emitting layer 43, a second light emitting layer 44, an electron transport layer 45. The second electrode 5 may be a transparent electrode, a reflective electrode, or a semi-transmissive electrode. The protective layer 6 reduces moisture from penetrating into the organic compound layer. The protective layer 6 is illustrated as one layer but may be a plurality of layers. There may be an inorganic compound layer and an organic compound layer for each of the plurality of layers.

The color filters are divided into 7R, 7G, 7B corresponding to their colors. The color filters may be formed on a planarizing film (not illustrated). Further, a resin protective layer (not illustrated) may be provided on the color filter. A color filter may also be formed on the protective layer 6. Alternatively, the color filters, after being provided on an substrate such as a glass substrate, may be bonded to the member on which the pixel is formed.

Figure 12B:
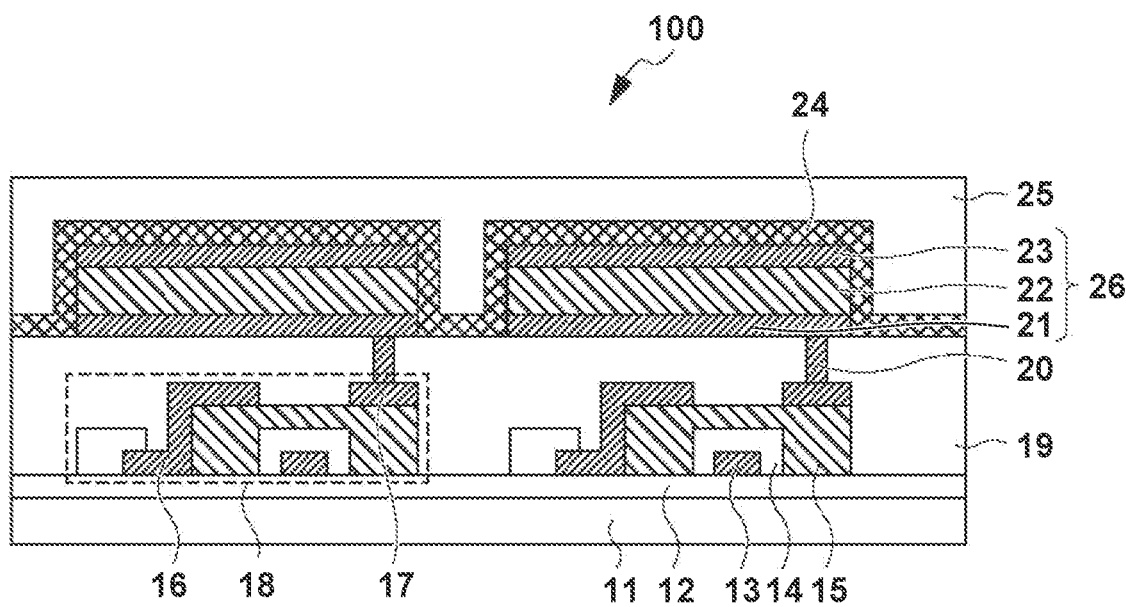
FIG. 12B is a schematic cross-sectional view of an example of a display device using the light emitting device according to the embodiment.

A display device 100 will be described using FIG. 12B. In FIG. 12B, an organic light-emitting element 26 and a thin film transistor (TFT) 18 as an example of a transistor are described.

An insulating layer 12 is provided on top of a substrate 11 such as glass or silicon. On the insulating layer, an active element 18 such as a TFT is disposed, as well as a gate electrode 13, a gate insulating film 14, a semiconductor layer 15 of the TFT 18. The TFT 18 also has a drain electrode 16 and a source electrode 17. An insulating film 19 is provided over the TFT 18. An anode 21 constituting the organic light-emitting element 26 and the source electrode 17 are connected via a contact plug 20 provided in the insulating film.

Note that a method of electrical connection between the electrodes (anode and cathode) included in the organic light-emitting element 26 and the electrodes (source electrode and drain electrode) included in the TFT is not limited to the embodiment illustrated in FIG. 12B. That is, either one of the anode or cathode and either one of the source electrode or drain electrode of the TFT need only be electrically connected.

In the display device 100 of FIG. 12B, the organic compound layer is illustrated as one layer, but an organic compound layer 22 may be a plurality of layers. A first protective layer 24 and a second protective layer 25 for reducing deterioration of the organic light-emitting element are provided over a cathode 23. Although a transistor is used as a switching element in the display device 100 of FIG. 12B, another switching element may be used instead.

The transistor used in the display device 100 of FIG. 12B is not limited to a transistor using a single-crystal silicon wafer and may be a thin film transistor having an active layer on the insulating surface of the substrate. Examples of the active layer include single-crystal silicon, amorphous silicon, non-single-crystal silicon such as microcrystalline silicon, indium zinc oxide, non-single-crystal oxide semiconductor such as indium gallium zinc oxide, and the like.

Transistors included in the display device 100 of FIG. 12B may be formed in a substrate such as a Si substrate. Here, formed in the substrate means to fabricate a transistor by processing the substrate, such as a Si substrate, itself. That is, having a transistor in the substrate can also be seen as forming the substrate and the transistor to be integrated with each other.

The emission luminance of an organic light-emitting element of the display device 100 according to the present embodiment is controlled by a TFT, which is an example of a switching element. Providing a plurality of organic light-emitting elements in the plane of the display device 100 makes it such that the emission luminance of the respective organic light-emitting elements can be used to display an image. The switching element according to the present embodiment is not limited to the TFT and may be a transistor formed of low-temperature polysilicon or an active matrix driver formed on a substrate such as a Si substrate. On the substrate can also be within the substrate. Whether to provide a transistor in the substrate, use a TFT, or the like may be selected depending on the size of the display unit. For example, if the size of the display unit is about 0.5 inches, it is possible to provide the organic light-emitting elements on the Si substrate.

An example of applying the light emitting device 101 of the present embodiment to a display device, a photoelectric conversion device, an electronic device, a lighting device, a mobile body, and a wearable device will be described below with reference to FIGS. 13 to 17.

The light emitting device 101 according to the present embodiment can be used as a constituent member of a display device or a lighting device and also has applications such as an exposure light source of an electrophotographic image forming device, a backlight of a liquid crystal display device, and a light emitting device having a color filter over a white light source.

The display device according to the present embodiment includes an image information processing device that has an image input unit for inputting image information from an area CCD, a linear CCD, a memory card, or the like, an information processing unit for processing the inputted information, and a display unit for displaying the inputted image. The display device may be used for the display unit of an image capturing device or ink jet printer, and the display unit may have a touch panel function. The driving method of the touch panel function may be an infrared ray method, an electrostatic capacitance method, a resistance film method, or an electromagnetic induction method and is not particularly limited. The display device may be used in the display unit of a multi-function printer.

Figure 13:
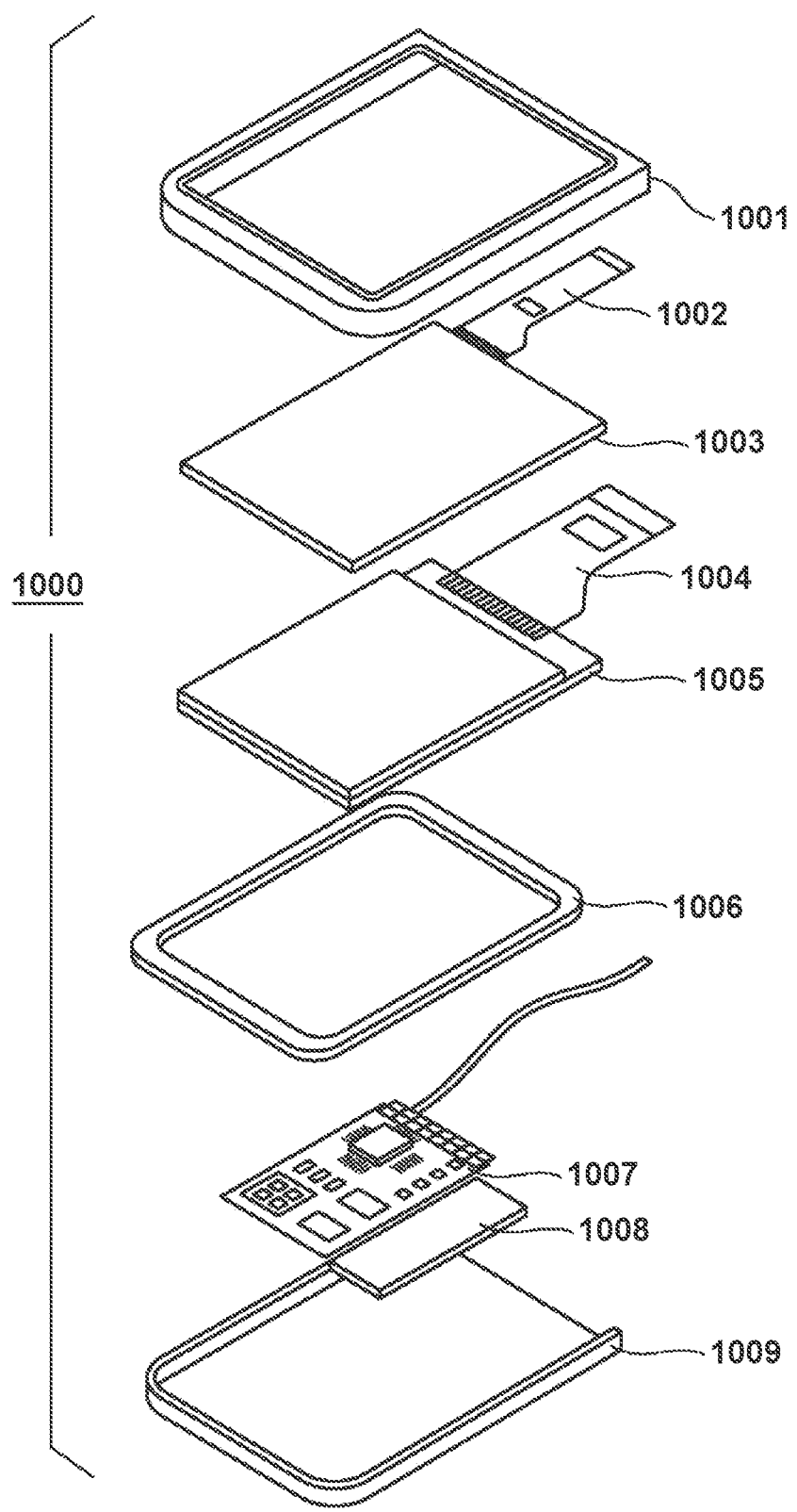
FIG. 13 is a schematic diagram illustrating an example of the display device.

First, an example of a display device using the light emitting device 101 of the present embodiment will be described with reference to FIG. 13. A display device 1000 may include a touch panel 1003, a display panel 1005, a frame 1006, a circuit board 1007, and a battery 1008 between an upper cover 1001 and a lower cover 1009. Flexible printed circuit FPCs 1002 and 1004 are connected to the touch panel 1003 and the display panel 1005. Circuit elements such as transistors are mounted on the circuit board 1007. The light emitting device 101 according to the present embodiment can be applied to the display panel 1005. The light emitting device 101 can be driven by transistors mounted on the circuit board 1007. The battery 1008 does not need to be provided if the display device is not a portable device and does not need to be provided at this position even if the display device is a portable device.

The display device according to the present embodiment may have color filters having red, green, blue colors. Regarding the color filters, the red, green, and blue colors may be arranged in a delta array. The display device according to the present embodiment may be used in a display unit of a portable terminal. In such a case, it may have both a display function for displaying information and a function for operating the terminal. Examples of a portable terminal include mobile phones such as smartphones, tablets, head mounted displays, and the like.

The display device according to the present embodiment may be used in a display unit of an image capturing device having an optical unit including a plurality of lenses and an image capturing element for receiving light passing through the optical unit. The image capturing device may have a display unit for displaying information that the image capturing element has acquired. Further, the display unit may be a display unit exposed to the outside of the image capturing device or a display unit arranged in a viewfinder. The image capturing device may be a digital camera or a digital video camera.

Figure 14A:
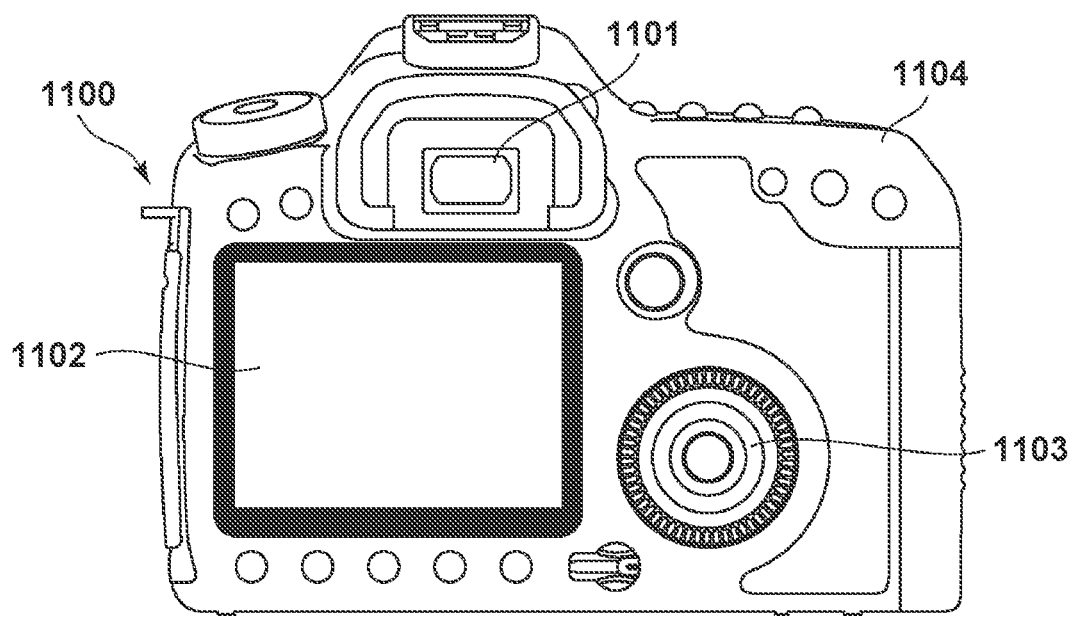
FIG. 14A is a schematic diagram illustrating an example of an image capturing device.

FIG. 14A is a schematic diagram illustrating an example of an image capturing device according to the present embodiment. An image capturing device 1100 may include a viewfinder 1101, a rear display 1102, an operation unit 1103, and a housing 1104. The light emitting device 101 according to the present embodiment can be applied to the viewfinder 1101. In such a case, the light emitting device 101 functions as a display unit and may display not only an image to be captured but also environmental information, an image capturing instruction, and the like. The environmental information may be the intensity of external light, direction of external light, speed at which a subject moves, possibility that a subject is shielded by a shielding object, and the like.

Since the timing that is suitable for capturing is a small window of time, it is better to display the information as early as possible. Therefore, it is advantageous to use a light emitting device using an organic light-emitting element according to the embodiment in a display device. This is because organic light-emitting elements generally have higher response speeds than liquid crystal displays. It is advantageous to use a display device using an organic light-emitting element for a device in which display speed is required.

The image capturing device 1100 has an optical unit (not illustrated). The optical unit may have a plurality of lenses. The optical unit forms an image of a subject on the image capturing element accommodated in the housing 1104. The plurality of lenses, by adjusting their relative positions, can adjust focus. This operation can also be performed automatically. The image capturing device may be referred to as a photoelectric conversion device. The photoelectric conversion device may include, as a method of image capturing, a method of detecting a difference from the previous image, a method of cutting out an image from an image that is always being recorded, and the like, rather than sequential image capturing.

Figure 14B:
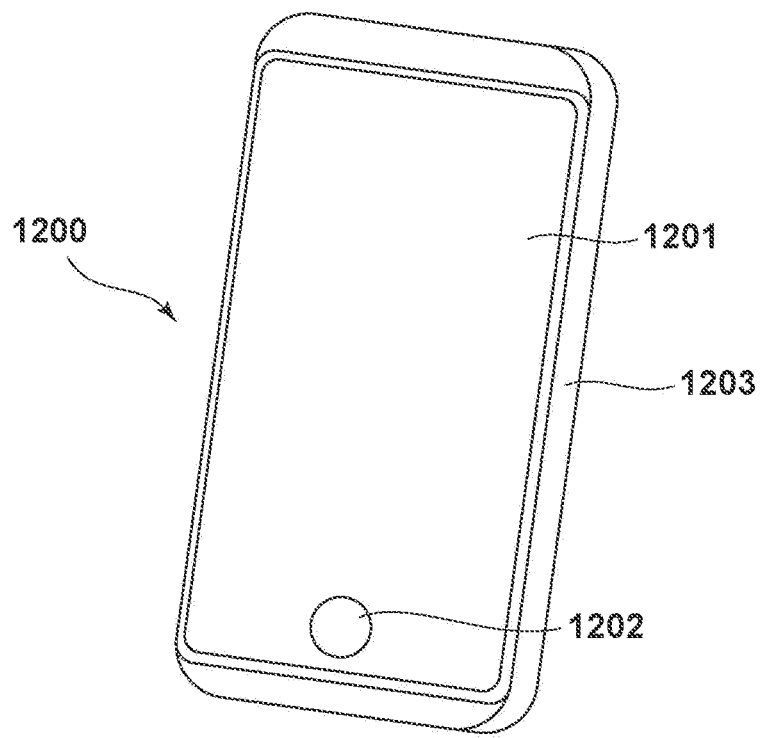
FIG. 14B is a schematic diagram illustrating an example of an electronic device.

FIG. 14B is a schematic diagram illustrating an example of an electronic device according to the present embodiment. An electronic device 1200 includes a display unit 1201, an operation unit 1202, a housing 1203. The light emitting device 101 can be applied to the display unit 1201. The housing 1203 may include a circuit, a printed circuit board having the circuit, a battery, and a communication unit. The operation unit 1202 may be a button or a touch-panel-type reaction unit. The operation unit may be a biometrics unit that recognizes fingerprints and performs unlocking or the like. An electronic device having a communication unit can also be referred to as a communication device. The electronic device may further include an image capture function by comprising a lens and an image capturing element.

An image captured by the image capture function is displayed on the display unit. Examples of the electronic device include smartphones, laptops, and the like.

Figure 15A:
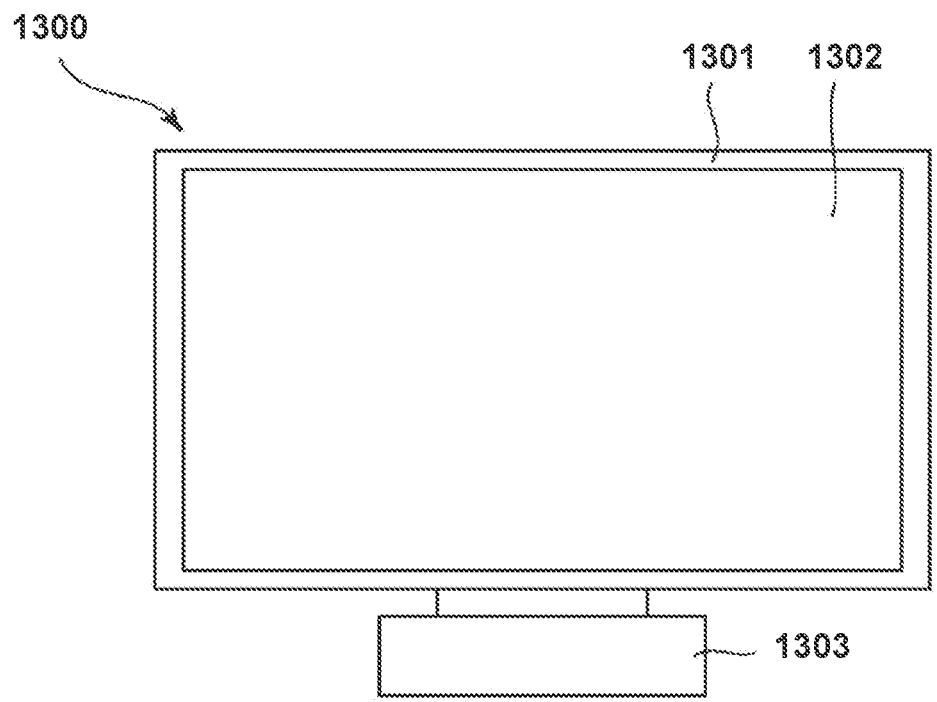
FIG. 15A is a schematic diagram illustrating an example of the display device.
Figure 15B:
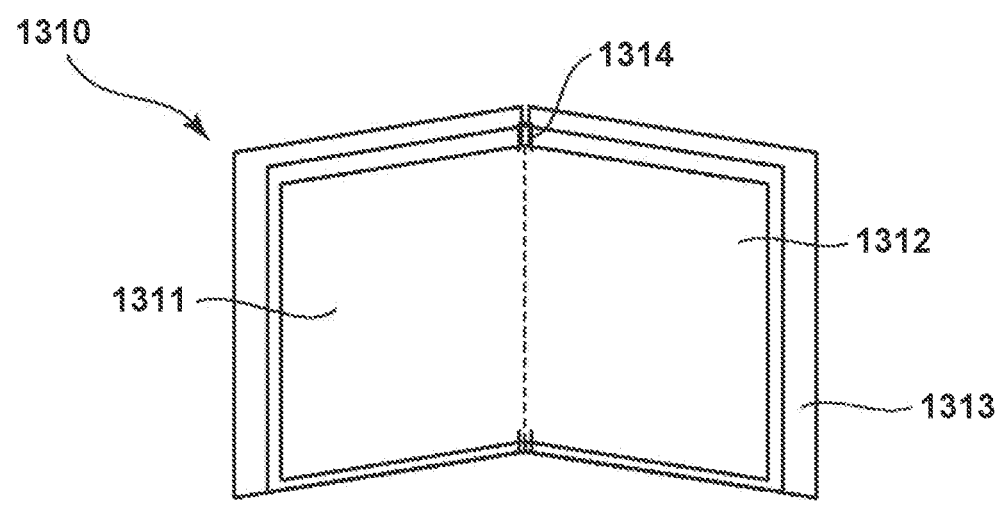
FIG. 15B is a schematic diagram illustrating an example of a foldable display device.

FIGS. 15A and 15B are schematic diagrams illustrating examples of a display device using the light emitting device 101 of the present embodiment. FIG. 15A may be a display device such as a TV monitor or a PC monitor. A display device 1300 has a frame 1301 and a display unit 1302. The light emitting device 101 according to the present embodiment can be applied to the display unit 1302. The display device 1300 has a base 1303 for supporting the frame 1301 and the display unit 1302. The base 1303 is not limited to the form of FIG. 15A. The lower side of the frame 1301 may also serve as a base. Further, the frame 1301 and the display unit 1302 may be curved. Its radius of curvature may be 5000 mm or more and 6000 mm or less.

FIG. 15B is a schematic diagram illustrating another example of a display device using the light emitting device 101 of the present embodiment. A display device 1310 of FIG. 15B is configured to be foldable and is a so-called foldable display device. The display device 1310 includes a first display unit 1311, a second display unit 1312, a housing 1313, a bending point 1314. The light emitting device 101 according to the embodiment can be applied to the first display unit 1311 and the second display unit 1312. The first display unit 1311 and the second display unit 1312 may be a single display device without joints. The first display unit 1311 and the second display unit 1312 can be divided at the bending point 1314. The first display unit 1311 and the second display unit 1312 may each display a different image, or one image may be displayed across the first and second display unit.

Figure 16A:
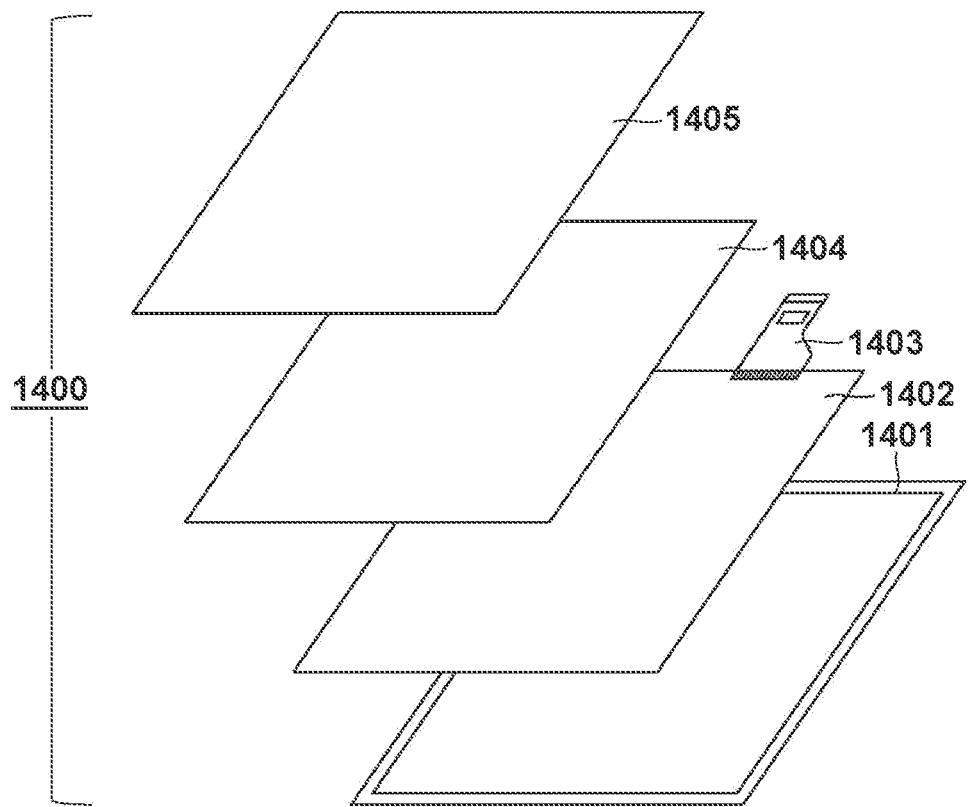
FIG. 16A is a schematic diagram illustrating an example of a lighting device.

FIG. 16A is a schematic diagram illustrating an example of a lighting device using the light emitting device 101 according to the present embodiment. A lighting device 1400 may include a housing 1401, a light source 1402, a circuit board 1403, an optical film 1404, and a light diffusing unit 1405. The light emitting device 101 according to the present embodiment can be applied to the light source 1402. The optical film may be a filter that improves the color rendering property of the light source. The light diffusing unit 1405 can effectively diffuse the light of the light source deliver light in a wide range, such as in a light-up. The optical film 1404 and the light diffusing unit 1405 may be provided on the light emission side of the illuminator. If necessary, a cover may be provided on the outermost portion. Thus, in this specification, the display device is not limited to those for displaying an image and also includes those in which a plurality of light-emitting elements are arranged and used as a light source.

The lighting device 1400 is, for example, a device for illuminating a room. The lighting device 1400 may emit white light, neutral white color, or any of blue to red colors. A dimming circuit for dimming them may be provided. The lighting device 1400 may include the light emitting device 101 applied to the light source 1402 and a power supply circuit connected thereto. The power supply circuit includes a circuit for converting an AC voltage into a DC voltage and a circuit for adjusting the voltage. In addition, white light has a color temperature of 4200K, and neutral white color has a color temperature of 5000K. The lighting device may have a color filter. Further, the lighting device according to the present embodiment may have a heat dissipation portion. The heat dissipation portion is for releasing heat inside the device to outside of the device and examples include a metal having a high specific heat, liquid silicon and the like.

Figure 16B:
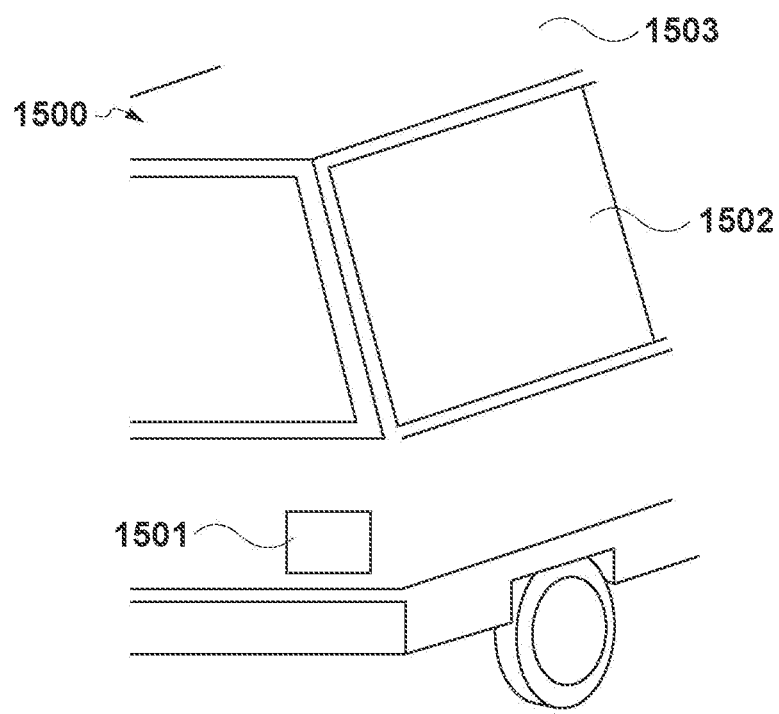
FIG. 16B is a schematic diagram illustrating an example of an automobile having a lighting unit for vehicles.

FIG. 16B is a schematic diagram of an automobile, which is an example of a mobile body according to the present embodiment. The automobile has a tail lamp, which is an example of a lighting unit. An automobile 1500 has a tail lamp 1501 and may have a form in which a tail lamp is lit when a brake operation or the like is performed. The light emitting device 101 according to the present embodiment can be applied to the tail lamp 1501. The tail lamp may have a protective member that protects the light emitting device 101. The protective member has a relatively high strength and can be made of any material, such as polycarbonate, as long as the material is transparent. A furandicarboxylic acid derivative, an acrylonitrile derivative, or the like may be mixed into the polycarbonate.

The automobile 1500 may have a vehicle body 1503 and windows 1502 attached thereto. The windows may be transparent displays so long as they are not windows for checking the front and rear of the automobile. Such transparent displays may have a light emitting device having an organic light-emitting element according to the present embodiment. In this case, the constituent material such as an electrode that the organic light-emitting element has is configured by a transparent member. The mobile body according to the present embodiment may be a ship, an aircraft, a drone, or the like. The mobile body may have a body and a lighting unit provided on the body. The lighting unit may emit light to inform the position of the body. The lighting unit has an organic light-emitting element according to the present embodiment.

Referring to FIG. 17, an example for further applying the light emitting device 101 of each embodiment described above to a display device will be described. The light emitting device 101 can be applied to a system that can be worn as wearable devices such as smart glasses, HMDs, and smart contacts. Image capturing and displaying devices used in such application examples have an image capturing device that can photoelectrically convert visible light and a light emitting device capable of emitting visible light.

Figure 17A:
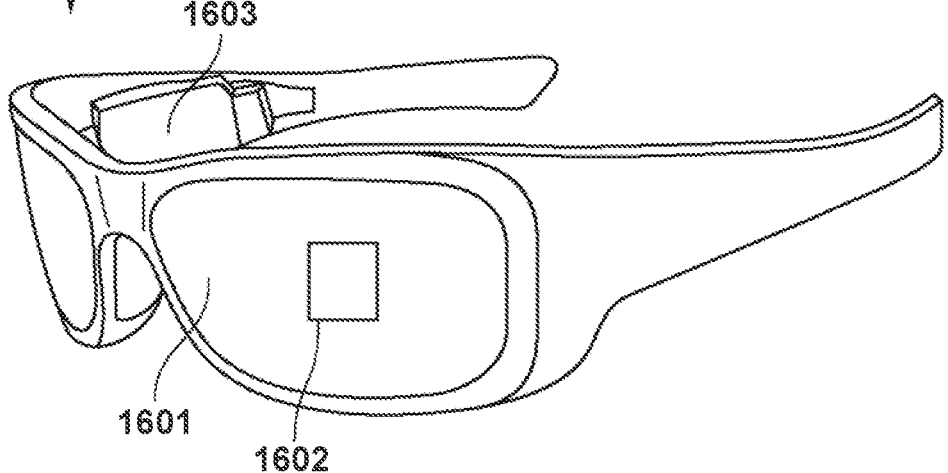
FIG. 17A is a schematic diagram illustrating an example of a wearable device.

Referring to FIG. 17A, glasses 1600 (smart glass) will be described as an example. On the front surface side of a lens 1601 of the glasses 1600, an image capturing device 1602 such as a CMOS sensor or an SPAD is provided. Further, on the rear surface side of the lens 1601, the light emitting device 101 of each embodiment described above is provided.

The glasses 1600 further comprise a control device 1603. The control device 1603 may serve as a power supply for supplying power to the image capturing device 1602 and the display device including the light emitting device 101 according to each embodiment. The control device 1603 may also control the operation of the image capturing device 1602 and the light emitting device 101. An optical system for focusing the light onto the image capturing device 1602 is formed in the lens 1601.

Figure 17B:
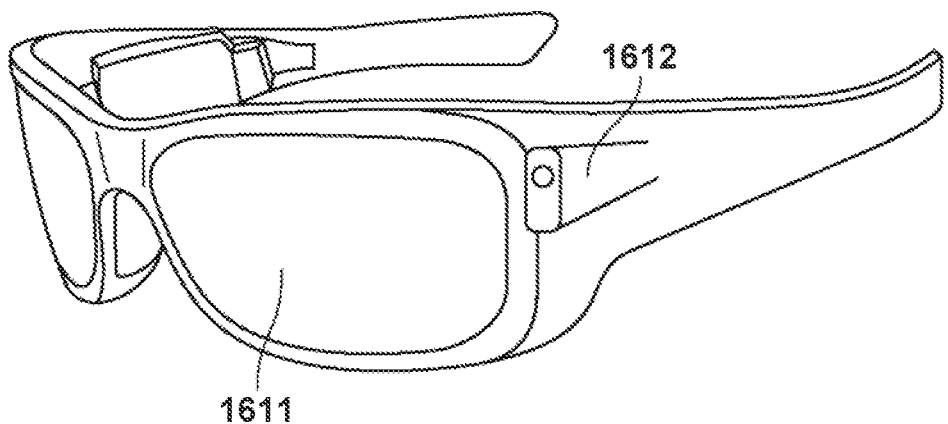
FIG. 17B is a schematic diagram illustrating an example of a wearable device having an image capturing device.

Referring to FIG. 17B, other glasses 1610 (smart glass) will be described as an example. The glasses 1610 have a control device 1612, and an image capturing device corresponding to the image capturing device 1602 and the light emitting device 101 are mounted on the control device 1612. The image capturing device in the control device 1612 and an optical system for projecting light emission from the light emitting device 101 are formed in a lens 1611, and an image is projected on the lens 1611. The control device 1612 serves as a power supply for supplying power to the image capturing device and the light emitting device 101 and can control the operation of the image capturing device and the light emitting device 101. The control device may have a line-of-sight detection unit that detects the line of sight of a wearer. Infrared rays may be used to detect the line of sight. The infrared light emitting unit emits infrared light to the eye of the user looking at a display image. A captured image of an eye is obtained by an image capturing unit having a light receiving element detecting the infrared light reflected from an eye. At this time, it is possible to reduce the deterioration of image quality by providing a portion for reducing light entering from the infrared light emitting portion to the display unit in a plan view.

The line of sight of the user with respect to the displayed image is detected from the captured image of the eye obtained by capturing the infrared light. Any technique can be applied for detecting the line of sight using the captured image of the eye. As an example, a line-of-sight detection method based on Purkinje images, which are reflections of irradiated light off the cornea, can be used. More specifically, sight line detection processing based on a pupil corneal reflection method is performed. Using the pupil corneal reflection method, the line of sight of the user is detected by calculating a line-of-sight vector representing the direction (rotation angle) of the eye based on the image of the pupil included in the captured image of the eye and the Purkinje image.

A display device comprising the light emitting device 101 according to the embodiment has an image capturing device having a light receiving element and may control an image displayed based on the user's line-of-sight information from the image capturing device. Specifically, based on the line-of-sight information, a first field-of-view region at which the user is looking and a second field-of-view region other than the first field-of-view region may be determined. The first field-of-view region and the second field-of-view region may be determined by the control device of the display device, or the first field-of-view region and the second field-of-view region that an external control device has determined may be received and used.

In the display region of the display device, the display resolution of the first field-of-view region may be controlled to be higher than the display resolution of the second field-of-view region. That is, the resolution of the second field-of-view region may be lower than that of the first field-of-view region.

Further, the display region has a first display region and a second display region, different from the first display region, and a region of higher priority is determined from the first display region and the second display region based on the line-of-sight information. The first field-of-view region and the second field-of-view region may be determined by the control device of the display device, or the first field-of-view region and the second field-of-view region that an external control device has determined may be received and used. The resolution of the region of higher priority may be controlled to be higher than the resolution of the region other than the region of higher priority. In other words, the resolution of the region of relatively low priority may be reduced.

Incidentally, AI may be used to determine the first field-of-view region or the region of higher priority. AI may be a model configured to estimate, from an image of an eye, the angle of the line of sight and the distance to a target beyond the line of sight using, as training data, an image of an eye and the actual direction in which the eye was looking. An AI program may be included in a display device, an image capturing device, or an external device. If an external device is to determine a region, information is transmitted to the display device via communication.

When controlling the display based on the line-of-sight detection, application can be made to smart glasses further having an image capturing device for capturing the outside. The smart glasses can display external information captured in real time. Further, it is possible to control the displayed external information by detecting an instruction by the line of sight.

As described above, using a device that uses the organic light-emitting element according to the present embodiment makes it possible to perform a stable display with good image quality even in a long-term display.

According to the present invention, it possible to provide a light emitting device that is advantageous for changing the range of currents that flow through light-emitting elements with respect to signal voltages inputted to the light-emitting elements.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-008189, filed Jan. 21, 2021, which is hereby incorporated by reference herein in its entirety.

What is claimed is:

1. A light emitting device comprising:
a plurality of pixels, each having a light-emitting element, a driving transistor configured to drive the light-emitting element, a capacitor configured to hold a threshold voltage of the driving transistor, a signal line, a first switch configured to connect the signal line and a control electrode of the driving transistor, and a second switch configured to connect a first main electrode of the driving transistor and a predetermined node; and
a driving circuit configured to drive the signal line, wherein
in a preparation period in which the threshold voltage is held in the capacitor, the first switch is controlled to be on and the second switch is controlled to be off, and the driving circuit drives the signal line at a voltage level selected from a plurality of different voltage levels, and
in a signal write period in which a luminance signal value is written to the light-emitting element, the first switch is controlled to be on and the second switch is controlled to be off, and the driving circuit drives the signal line at a voltage that corresponds to the luminance signal value.

2. The light emitting device according to claim 1, wherein the plurality of difference voltage levels include a first voltage and a second voltage, and
the light-emitting element emits light in a first mode in which the first voltage is supplied and the threshold voltage is held or a second mode in which the second voltage is supplied and the threshold voltage is held.

3. The light emitting device according to claim 2, wherein the first voltage is smaller than the second voltage, and
when the signal line is driven at the same voltage, which is a voltage that corresponds to the luminance signal value in the first mode and the second mode, in the signal write period, the light-emitting element emits light at a higher luminance in the second mode than in the first mode.

4. The light emitting device according to claim 2, wherein the first voltage is smaller than the second voltage, and the light-emitting element emits light at a lower luminance in the second mode than in the first mode with respect to the luminance signal value of the same value.

5. The light emitting device according to claim 1, wherein the selected voltage level is selected from among the plurality of difference voltage levels in accordance with an environmental temperature of the light-emitting element.

6. The light emitting device according to claim 5, wherein when the environmental temperature is lower than a predetermined temperature, a higher voltage level is selected from among the plurality of different voltage levels.

7. The light emitting device according to claim 1, wherein a third switch is further connected between an anode and a cathode of the light-emitting element.

8. The light emitting device according to claim 1, further comprising: a control unit, wherein the driving circuit selects a voltage from among the plurality of different voltage levels in accordance with an instruction from the control unit.

9. A photoelectric conversion device comprising: an optical unit having a plurality of lenses; an image capturing element configured to receive light that has passed through the optical unit; and a display unit configured to display an image that the image capturing element has captured, wherein the display unit includes the light emitting device according to claim 1.

10. An electronic device comprising: a display unit having the light emitting device according to claim 1; a housing in which the display unit is provided; and a communication unit provided in the housing and configured to communicate with an external unit.

11. A lighting device comprising: a light source having the light emitting device according to claim 1; and a light diffusing unit or an optical film configured to transmit light that the light source emits.

12. A mobile body comprising: a lighting unit having the light emitting device according to claim 1; and a body in which the lighting unit is provided.

\* \* \* \* \*